United States Patent
Iwai et al.

(10) Patent No.: US 11,372,342 B2
(45) Date of Patent: Jun. 28, 2022

(54) POSITION MEASUREMENT APPARATUS, OVERLAY INSPECTION APPARATUS, POSITION MEASUREMENT METHOD, IMPRINT APPARATUS, AND ARTICLE MANUFACTURING METHOD

(71) Applicant: CANON KABUSHIKI KAISHA, Tokyo (JP)

(72) Inventors: Toshiki Iwai, Tokyo (JP); Takamitsu Komaki, Tokyo (JP); Tomokazu Taki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/152,362

(22) Filed: Jan. 19, 2021

(65) Prior Publication Data
US 2021/0263432 A1 Aug. 26, 2021

(30) Foreign Application Priority Data
Feb. 21, 2020 (JP) .............................. JP2020-027874

(51) Int. Cl.
*G03F 9/00* (2006.01)
*G03F 7/20* (2006.01)

(52) U.S. Cl.
CPC ........ *G03F 9/7023* (2013.01); *G03F 7/70633* (2013.01); *G03F 9/7042* (2013.01); *G03F 9/7046* (2013.01); *G03F 9/7084* (2013.01); *G03F 9/7092* (2013.01)

(58) Field of Classification Search
CPC .. G03F 7/70633; G03F 9/7042; G03F 9/7088; G03F 9/7092; G03F 9/7003; G03F 9/7023; G03F 9/7065; G03F 9/7069; G03F 9/7084
See application file for complete search history.

(56) References Cited

U.S. PATENT DOCUMENTS

| 6,100,987 A | * | 8/2000 | Kawakubo | ............ | G03F 9/7088 |
| | | | | | 356/401 |
| 6,696,220 B2 | | 2/2004 | Bailey | | |
| 7,643,961 B2 | | 1/2010 | Matsumoto | | |
| 2007/0064233 A1 | * | 3/2007 | Takagi | .................. | G03F 9/7069 |
| | | | | | 356/401 |

(Continued)

FOREIGN PATENT DOCUMENTS

JP 2004117030 A 4/2004

*Primary Examiner* — Steven Whitesell Gordon
(74) *Attorney, Agent, or Firm* — Rossi, Kimms & McDowell LLP

(57) ABSTRACT

Provided is a position measurement apparatus in which a measurement error in a target is reduced.
A position measurement apparatus measuring a position of a target includes an illumination unit configured to illuminate the target with illumination light including light of a first wavelength and light of a second wavelength different from the first wavelength, a measurement unit configured to measure the position of the target by detecting light from the target illuminated with the illumination light, and a control unit configured to adjust a ratio of a light intensity of the first wavelength to a light intensity of the second wavelength such that a measurement error varying depending on the position of the target in the measurement unit is reduced.

18 Claims, 21 Drawing Sheets

(56) References Cited

U.S. PATENT DOCUMENTS

2012/0307226 A1\* 12/2012 Maeda ................. G03F 9/7069
355/72
2017/0235232 A1\* 8/2017 Toshima ............ G03F 7/70633
355/72

\* cited by examiner

POSITION MEASUREMENT APPARATUS, OVERLAY INSPECTION APPARATUS, POSITION MEASUREMENT METHOD, IMPRINT APPARATUS, AND ARTICLE MANUFACTURING METHOD

BACKGROUND OF THE INVENTION

Field of the Invention

The present invention relates to a position measurement apparatus, an overlay inspection apparatus, a position measurement method, an imprint apparatus, and an article manufacturing method.

Description of the Related Art

Recently, fine processing technologies for transfer pressing a microstructure on a mold to a workpiece such as a semiconductor, and glass, resin, or metal have been developed and are attracting attention. Since the technologies are performed with a resolution on the order of several nanometers, they are referred to as nano-imprinting, nano-embossing, or the like, and they can collectively process a three-dimensional structure at a wafer level in addition to manufacturing a semiconductor. These are expected to be applied to a wide range of fields as technologies for manufacturing optical elements such as photonic crystals, micro total analysis systems (μ-TAS), biochips, and the like. Regarding such nano-imprinting, for example, a case in which an optical imprinting method is used for a technology for manufacturing a semiconductor will be described below.

First, a resin layer made of a photo-curing resin is formed on a substrate (wafer) that is a target to be measured. Next, a mold having a desired uneven structure formed therein is caused to abut the resin layer and pressing is performed. Thereafter, the photo-curing resin is cured by being irradiated (illuminated) with ultraviolet rays, and the uneven structure is transferred to the resin layer. Moreover, etching or the like is performed using this resin layer as a mask, and thus the desired structure is formed on the substrate. Incidentally, at the time of such manufacturing of a semiconductor, there is a need for a mold and a substrate to be aligned. For example, in recent circumstances in which a process rule for a semiconductor involves 100 nm or smaller, a permissible range for an alignment error caused by an apparatus has become strict to an extent of being several nm to tens of nm.

Regarding such an alignment method, for example, in the specification of U.S. Pat. No. 6,696,220, a method for performing alignment in which a mold and a substrate are brought into contact with each other with a resin interposed therebetween has been proposed. In the method employed thereby, first, parts other than an alignment mark provided on a substrate are selectively coated with a photo-curing resin. Next, the substrate is moved to a position facing the mold. In this state, the distance between the mold and a workpiece is reduced such that the mold comes close to the substrate to a height to an extent that the alignment mark is not buried in the resin. In this state, alignment is performed, and final pressing is performed thereafter.

In relative alignment, measurement is performed after a mold and a substrate are brought into contact with each other with a resin therebetween. For this reason, at the time of measurement, a mark of the mold is filled with the resin. Therefore, if the material of the mold and the resin have similar physical property values, there is a problem that the mold mark may not be able to be seen.

When an alignment mark is detected, if there is an asymmetric processing error during manufacturing a wafer, an error occurs in a measurement value. In order to reduce an error, for example, in Japanese Patent Laid-Open No. 2004-117030, the same mark is measured under different conditions (wavelength, polarization of light, and the like), and an amount of positional deviation is obtained using a wavelength having the highest contrast.

An alignment mark is observed in order to measure a wafer position patterned on a wafer. If an asymmetric processing error (wafer induced shift) occurs within a wafer surface during manufacturing a wafer, a measurement value is deceptive at the time of observing the alignment mark, thereby causing a measurement error. If a significant measurement error occurs, the error leads to a flaw at the time of overlay exposure. Therefore, there is a need to reduce a measurement error.

SUMMARY OF THE INVENTION

An object of the present invention is to provide a position measurement apparatus in which a measurement error in a target is reduced, for example.

According to an aspect of the present invention, there is provided a position measurement apparatus measuring a position of a target. The position measurement apparatus includes an illumination unit configured to illuminate the target with illumination light including light of a first wavelength and light of a second wavelength different from the first wavelength, a measurement unit configured to measure the position of the target by detecting light from the target illuminated with the illumination light, and a control unit configured to adjust a ratio of a light intensity of the first wavelength to a light intensity of the second wavelength such that a measurement error varying depending on the position of the target in the measurement unit is reduced.

Further features of the present invention will become apparent from the following description of exemplary embodiments with reference to the attached drawings.

DESCRIPTION OF THE EMBODIMENTS

Hereinafter, with reference to the accompanying drawings, favorable embodiments of the present invention will be described using Examples. In each diagram, the same reference signs are applied to the same members or elements, and duplicate description will be omitted or simplified.

First Embodiment

Figure 2:
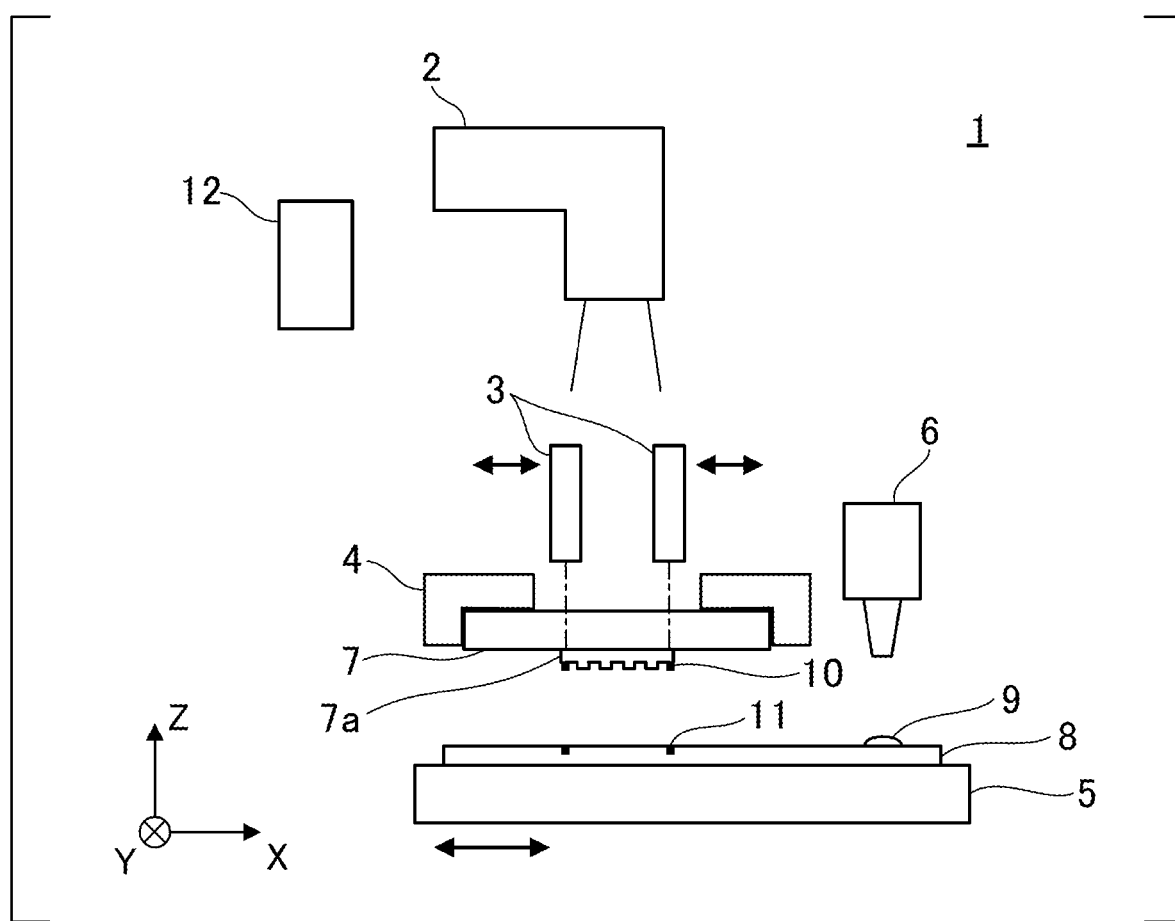
FIG. 2 is a view illustrating an example of an apparatus constitution of an imprint apparatus according to Example 1.

FIG. 2 is a view illustrating a constitution of an imprint apparatus 1 of Example 1. This imprint apparatus 1 is an apparatus which is used for manufacturing a device such as a semiconductor device, performs molding of an uncured resin (resist) 9 on a wafer (substrate) that is a processing object using a mold (a mold or a mask) 7, and forms (transfers) a pattern of the resin 9 on a substrate. Here, for example, the resin 9 is a resin which is cured with ultraviolet rays or the like. The imprint apparatus 1 of Example 1 employs a photo-curing method. In addition, in the following diagrams, an X axis and a Y axis orthogonal to each other are set within a plane parallel to the mold 7 and a wafer 8, and a Z axis is set in a direction perpendicular to the X axis and the Y axis. This imprint apparatus 1 includes a UV irradiation unit 2, a measurement optical system 3, a mold holding unit 4, a wafer stage 5, a coating unit 6, an acquisition unit (not illustrated), and a control unit 12.

The UV irradiation unit 2 is an UV irradiation apparatus irradiating the mold 7 with ultraviolet rays in order to cure the resin 9 after mold pressing processing in which the mold 7 and the resin 9 on the wafer 8 are brought into contact with each other. This UV irradiation unit 2 is constituted of a light source (not illustrated) and a plurality of optical elements for uniformly irradiating an uneven pattern 7a (which will be described below), which will become an irradiation object surface, with ultraviolet rays emitted from the light source in a predetermined shape. Particularly, it is desirable that an irradiation region (irradiation range) of light for the UV irradiation unit 2 be approximately the same as a surface area of the uneven pattern 7a or slightly larger than the surface area of the uneven pattern 7a. This is because expansion of the mold 7 or the wafer 8 caused by heat accompanying irradiation and occurrence of positional deviation or distortion in the pattern to be transferred to the resin 9 are curbed by having a minimum necessary irradiation region. Furthermore, it is also because abnormality in a subsequent operation of the coating unit 6 (which will be described below) is prevented from occurring due to ultraviolet rays which have been reflected by the wafer 8 or the like, have arrived at the coating unit 6, and have cured the resin 9 remaining in a discharge portion of the coating unit 6. Here, regarding the light source, for example, a high-pressure mercury lamp, various kinds of excimer lamps, an excimer laser, or a light emitting diode can be employed. This light source is suitably selected depending on the characteristics of the resin 9 (light reception object). However, Example 1 is not limited to a kind, a number, a wavelength, or the like of light sources.

A measurement optical system (an illumination unit and a measurement unit) 3 is an optical system for optically detecting a mold mark 10 disposed in the mold 7 and a wafer mark 11 disposed in the wafer 8 and measuring relative positions of both the marks. Moreover, the measurement optical system 3 functions as a part of an illumination unit configured to illuminate a target such as the wafer 8 with illumination light from an alignment light source 23. The measurement optical system 3 also functions as a part of a measurement unit configured to measure the relative position of a target by detecting light from the target illuminated with illumination light. In addition, the measurement optical system 3 is disposed such that an optical axis thereof is perpendicular to the mold 7 or the wafer 8. In addition, the measurement optical system 3 is constituted to be able to be driven in an X axis direction and a Y axis direction in accordance with a position of the mold mark 10 or the wafer mark 11. Moreover, the measurement optical system 3 is also constituted to be able to be driven in a Z axis direction in order to align a focal point of the optical system with the position of the mold mark 10 or the wafer mark 11. Driving of the wafer stage 5 or a magnification correction mechanism is controlled on the basis of information of the relative positions of the mold 7 and the wafer 8 measured by the measurement optical system 3. The measurement optical system 3, and the mold mark 10 and the wafer mark 11 (alignment marks) will be described below in detail.

A mold holding unit 4 is a mold holding unit configured to attract and hold the mold 7 due to a vacuum adsorption force or an electrostatic force. This mold holding unit 4 includes a mold chuck (not illustrated) and a mold driving mechanism for driving the mold chuck in the Z axis direction in order to press the mold 7 against the resin 9 coated on the wafer 8. Moreover, the mold holding unit 4 also includes a mold magnification correction mechanism for causing the mold 7 to be deformed in the X axis direction and the Y axis direction and correcting distortion of the pattern transferred to the resin 9. Each of operations of mole pressing and mold releasing in the imprint apparatus 1 may be realized by moving the mold 7 in a Z direction in this manner. However, for example, the operations may be realized by moving the wafer stage 5 (wafer 8) in the Z direction, or both thereof may be moved.

The wafer stage 5 is a wafer holding portion (substrate holding portion) for holding the wafer 8 using vacuum adsorption, for example, in a manner of being able to move within an XY plane.

A coating unit (dispenser) 6 is a coating unit configured to coat a part on the wafer 8 with the resin (uncured resin) 9. Here, for example, the resin 9 is a photo-curing resin having properties of being cured when it receives ultraviolet rays and is suitably selected depending on the kind of the semiconductor device. The coating unit 6 may have a constitution realized by separately preparing an external coating apparatus and introducing the wafer 8 coated with the resin 9 in advance using this coating apparatus into the imprint apparatus 1, without being installed inside the imprint apparatus 1 as illustrated in FIG. 2. According to this constitution, since coating inside the imprint apparatus 1 is eliminated, processing in the imprint apparatus 1 can be quickened. In addition, since the coating unit 6 is no longer necessary, manufacturing costs for the imprint apparatus 1 in its entirety can be curbed.

In addition, the mold 7 is a mold in which a predetermined pattern (for example, the uneven pattern 7a such as a circuit pattern) is formed in a three-dimensional shape on a surface facing the wafer 8. The material of the mold 7 is quartz or the like through which ultraviolet rays can be transmitted. In addition, for example, the wafer 8 is a processing object made of single crystal silicon, and a processing object surface thereof is coated with the resin 9 molded by the mold 7. The acquisition unit (not illustrated) acquires information of a ratio of light intensities (intensity ratio) of adjusted wavelengths of at least two or more kinds, which will be described below.

The control unit 12 controls the UV irradiation unit 2, the measurement optical system 3, the mold holding unit 4, the wafer stage 5, and the coating unit 6. For example, the control unit 12 may be constituted of a field programmable gate array (FPGA), a computer in which a program is embedded, or a combination of all or some of these. The FPGA may include a programmable logic device (PLD) or an application specific integrated circuit (ASIC). The control unit 12 is internally equipped with a memory, is internally equipped with a CPU serving as a computer, and functions as a control unit configured to execute various kinds of operation of the apparatus in its entirety, for example, based on relational expressions, parameters, or a computer program stored (saved) in the memory. In addition, a position measurement apparatus is constituted of the control unit 12, the alignment light source 23, the measurement optical system 3, and the like.

Next, imprint processing performed by the imprint apparatus 1 will be described. First, the wafer 8 is conveyed to the wafer stage 5 by a substrate conveyance unit (not illustrated), and this wafer 8 is placed and fixed. Subsequently, the wafer stage 5 is moved to a coating position of the coating unit 6. Thereafter, as coating, the coating unit 6 coats a predetermined pattern forming region (shot region) of the wafer 8 with the resin 9 (coating). Next, the wafer stage 5 is moved such that a coating surface on the wafer 8 is positioned immediately below the mold 7. Next, the mold driving mechanism is driven to perform mold pressing of pressing the mold 7 against the resin 9 on the wafer 8 (mold pressing). At this time, the resin 9 flows along the uneven pattern 7a formed in the mold 7 due to mold pressing of the mold 7. Moreover, in this state, the relative positions of the mold mark 10 and the wafer mark 11 disposed in the wafer 8 and the mold 7 are detected (measured) by the measurement optical system 3, and the mold pressing surface of the mold 7 and the coating surface on the wafer 8 are aligned by driving the wafer stage 5. Further, magnification correction or the like is performed for the mold 7 by the magnification correction mechanism (not illustrated). Here, the wafer stage (alignment unit) 5 functions as an alignment unit configured to align the mold 7 and the wafer 8. In a stage in which flowing of the resin 9 to the uneven pattern 7a, alignment between the mold 7 and the wafer 8, magnification correction of the mold, and the like have been adequately performed, the UV irradiation unit 2 irradiates the mold 7 with ultraviolet rays from the rear surface (upper surface) of the mold 7 and cures the resin 9 using the ultraviolet rays transmitted through the mold 7 (curing). At this time, the measurement optical system 3 is driven to retreat such that an optical path of the ultraviolet rays is not blocked. Subsequently, the mold driving mechanism is driven again to perform mold releasing of releasing the mold 7 from the wafer 8 (mold releasing). Accordingly, the uneven pattern 7a of the mold 7 is transferred onto (formed on) the wafer 8 (pattern formation).

Figure 3:
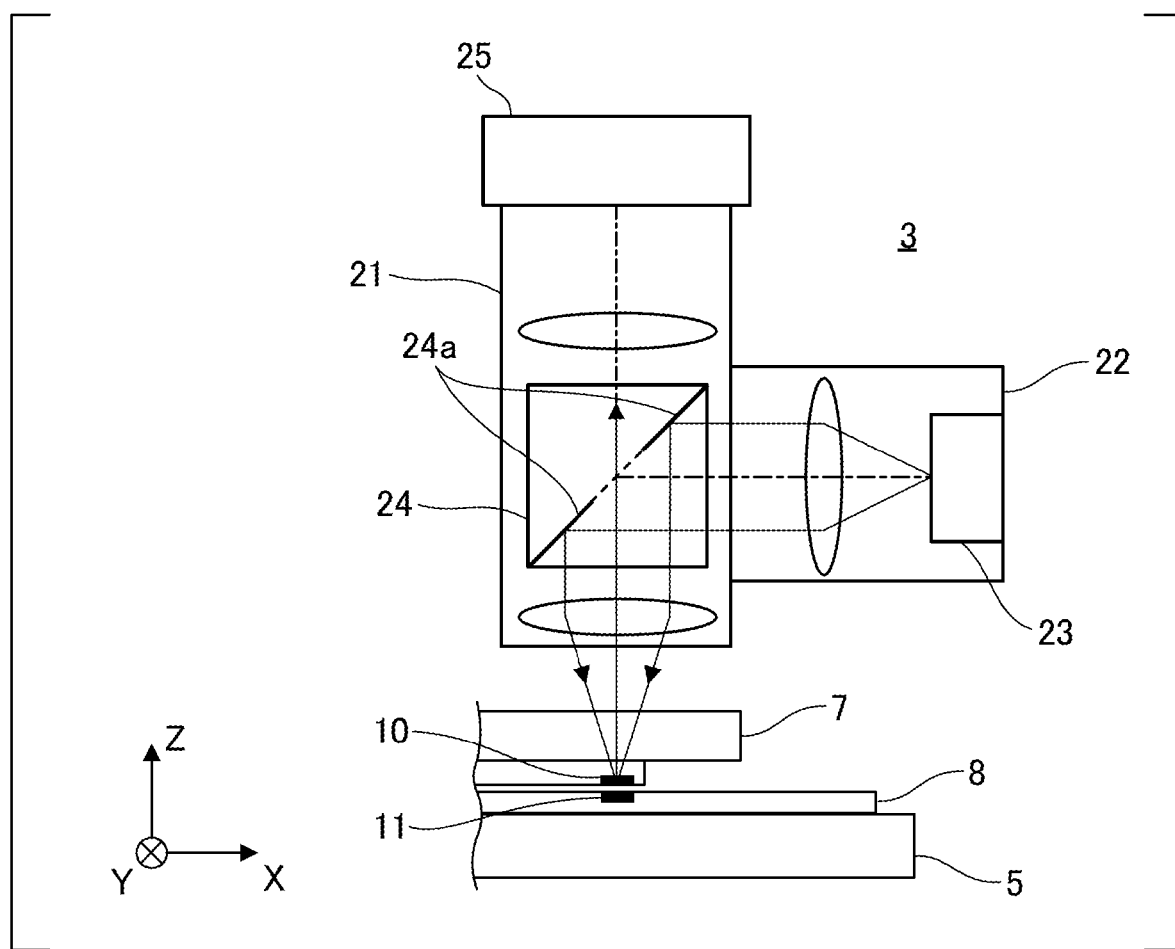
FIG. 3 is a view illustrating an example of a constitution of a measurement optical system according to Example 1.

Subsequently, details of the mold mark 10 and the wafer mark 11 respectively disposed in the measurement optical system 3 and the mold 7 and the wafer 8 for alignment will be described. FIG. 3 is a view illustrating an example of a constitution of the measurement optical system 3 of Example 1.

The measurement optical system 3 is constituted of a detection optical system 21 and an illumination optical system 22. On an image capturing element 25, the detection optical system 21 forms an image of an interference fringe (moire fringe) generated due to interference between rays of diffracted light from the mold mark 10 and the wafer mark 11 illuminated by the illumination optical system 22. The detection optical system 21 detects relative positions of a diffraction grating 41 and a diffraction grating 42, which will be described below. Moreover, the control unit 12 and the like also function as a measurement unit configured to measure diffracted light from the mold mark 10 and the wafer mark 11 and measure the relative position of the wafer 8. The illumination optical system 22 constitutes a part of the illumination unit configured to guide light from the alignment light source 23 onto the same optical axis as the detection optical system 21 using a prism 24 or the like and illuminate the mold mark 10 and the wafer mark 11. For example, a halogen lamp, an LED, a semiconductor laser (LD), a high-pressure mercury lamp, or a metal halide lamp is used as the alignment light source 23, which is constituted to perform irradiation with visible rays or infrared rays including no ultraviolet rays that cure the resin 9. In addition, the alignment light source 23 constitutes a part of the illumination unit. The detection optical system 21 and the illumination optical system 22 are constituted to share some of optical members constituting themselves, and the prism 24 is disposed on pupil surfaces of the detection optical system 21 and the illumination optical system 22 or in the vicinity thereof.

Each of the mold mark 10 and the wafer mark 11 (alignment marks) is constituted of a diffraction grating and has a regular pattern. On the image capturing element 25, the detection optical system 21 forms an image of an interference fringe (moire fringe) generated due to interference between rays of diffracted light from the mold mark 10 and the wafer mark 11 illuminated by the illumination optical system 22. A CCD, a CMOS, or the like is used as the image capturing element 25. Since an interference fringe (moire fringe) is generated using diffracted light of the mold mark 10 and the wafer mark 11, an amount of light of the moire fringe obtained according to diffraction efficiency of the mold 7 and the wafer 8 varies. Particularly, since the diffraction efficiency varies regularly with respect to the wavelength, a wavelength capable of efficiently detecting a moire fringe and a wavelength with which it is difficult to detect a moire fringe are manifested. Light of a wavelength with which it is difficult to detect a moire fringe may become noise.

A reflection film 24a for reflecting light of surrounding part on the pupil surface of the illumination optical system is constituted on a bonding surface of the prism 24. In addition, the reflection film 24a also serves as an opening diaphragm for regulating the size of a pupil (or detection NA:NAo) of the detection optical system 21. Here, the prism 24 may be a half prism having a semi-translucent film on the bonding surface, a plate-shaped optical element in which a reflection film is formed on an outer surface without being limited to a prism, or the like. In addition, a constitution in which the surrounding part of the prism 24 in FIG. 3 serves as a transmission portion, a central part serves as a reflection portion, and positions of the alignment light source 23 and the image capturing element 25 are switched may be adopted.

Figure 4:
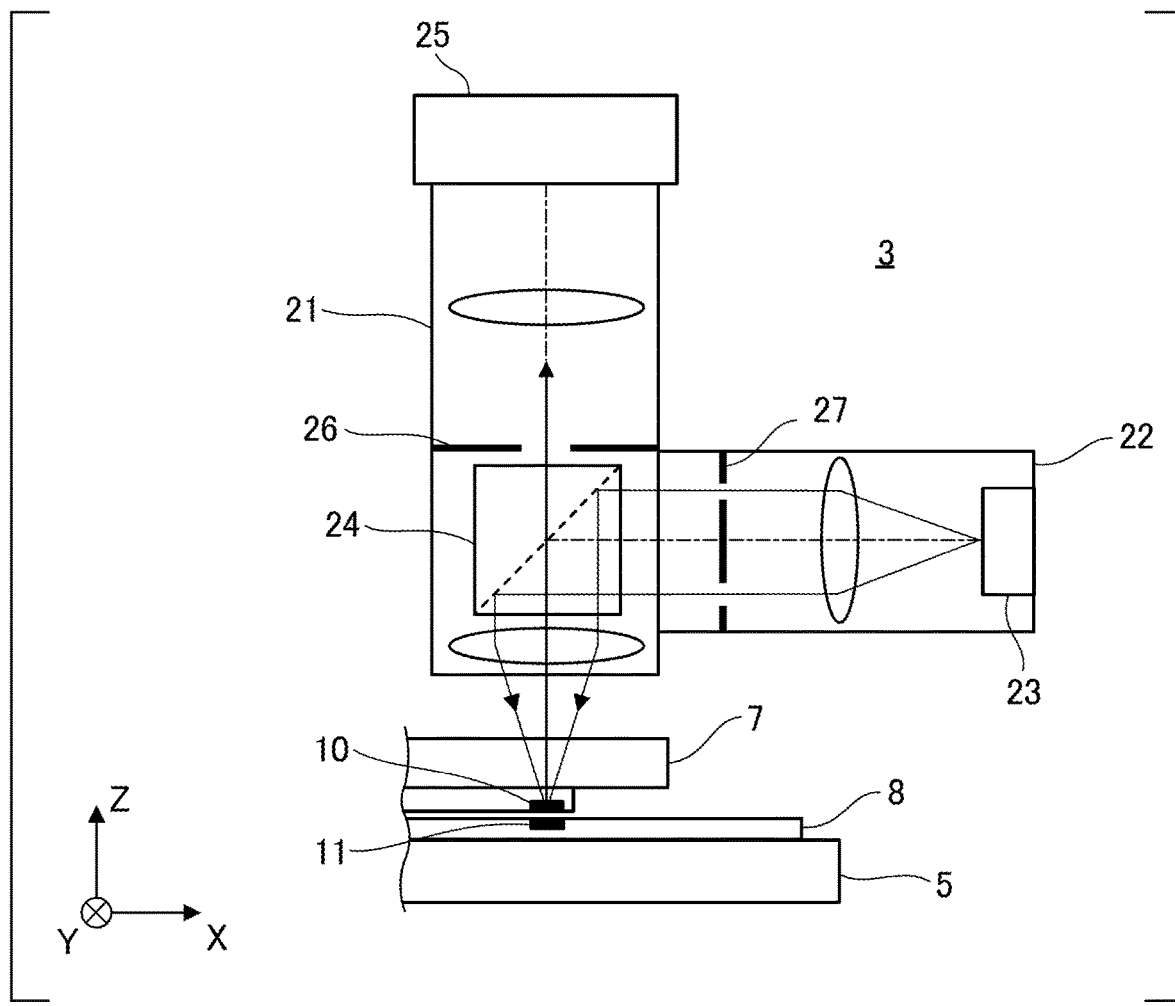
FIG. 4 is a view illustrating another example of a constitution of the measurement optical system of according to Example 1.

In addition, a position at which the prism 24 according to Example 1 is disposed may not necessarily be on the pupil surfaces of the detection optical system 21 and the illumination optical system 22 or in the vicinity thereof. FIG. 4 is a view illustrating an example of a constitution of such a measurement optical system 3. In the constitution of the measurement optical system 3 of this case, as illustrated in FIG. 4, the detection optical system 21 and the illumination optical system 22 respectively have opening diaphragms 26 and 27 on the pupil surfaces. In addition, a half prism or the like having a semi-translucent film on the bonding surface thereof is used as the prism 24.

Figure 1:
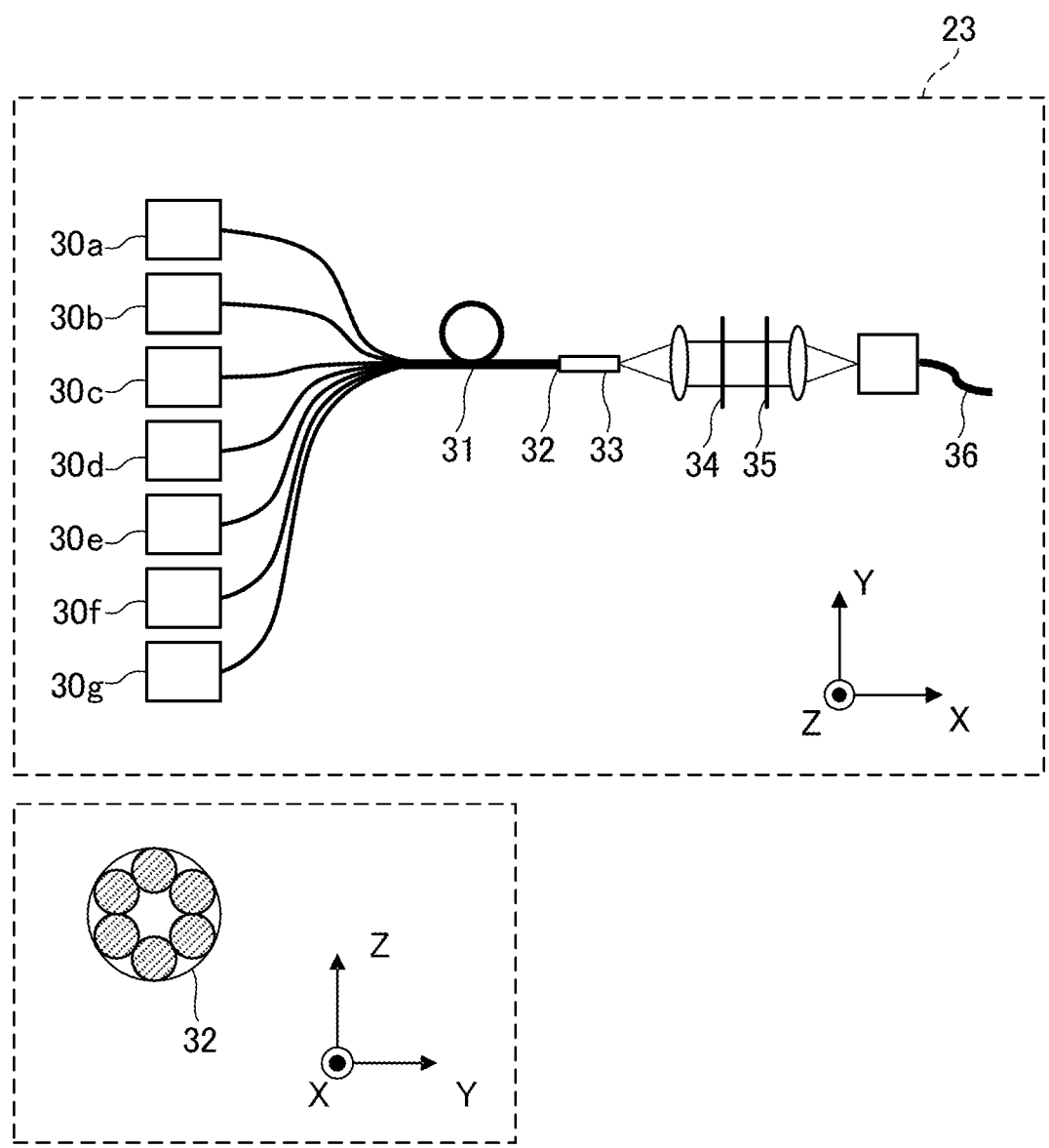
FIG. 1 is a view illustrating an example of a constitution of an alignment light source according to Example 1.

FIG. 1 is a view illustrating details of the alignment light source 23 according to Example 1. FIG. 1A is a schematic view illustrating an example of the alignment light source 23, and FIG. 1B is a schematic view illustrating an example of a fiber end surface 32. In the alignment light source 23 in FIG. 1A, for example, semiconductor lasers are constituted as light sources 30a to 30g that are a plurality of light emitting elements. In addition, the light sources 30a to 30g are not limited to semiconductor lasers. LEDs may be used, or lamps such as halogen lamps, metal halide lamps, high-pressure mercury lamps, or sodium lamps may be used. In addition, each of the light sources may be present in a mixed manner. The wavelengths of the semiconductor lasers constituted as the light sources 30a to 30g may differ in all the light sources 30a to 30g, or some may have the same wavelength in order to increase the amount of light of a particular wavelength. However, the light sources 30a to 30g have at least wavelengths of two or more kinds. For example, they have a first wavelength and a second wavelength that is a wavelength bandwidth different from the first wavelength. In addition, seven light sources 30a to 30g are illustrated in FIG. 1A, but the number is not limited to seven. At least one light source need only be provided, and an arbitrary number of light sources can be adopted. It is preferable to have many alternatives for choice of wavelengths in order to improve the measurement accuracy. In the case of semiconductor lasers, there is an advantage in that a semiconductor laser of each wavelength can be individually turned on or off and the amount of light can be adjusted.

A branching fiber (7-to-1 branching fiber) 31 is constituted of a plurality of fiber wires of which ends on one side are separated and ends on the other side are bundled. The ends on one side are connected to the plurality of light sources 30a to 30g and the ends on the other side are connected to an optical rod 33. In Example 1, the branching fiber is constituted of seven fiber wires. However, the number is not limited thereto, and an arbitrary number can be adopted. In the fiber end surface 32 in FIG. 1B, the shaded portions indicate cores of the fibers. For example, if a core diameter of each fiber is ϕ0.4 mm, a diameter of the bundled fiber end surface 32 may be approximately ϕ1.3 mm including a clad part. Seven fiber wires are bundled such that the area does not expand. However, they may be linearly disposed, may be concentrically disposed, or may be disposed such that a different shape is formed. Rays of light from the light sources 30a to 30g are respectively guided to the seven fibers and are unified on the fiber end surface 32. Since the semiconductor lasers of wavelengths are combined using the branching fiber 31, there is an advantage in that the degree of freedom for disposing the semiconductor lasers increases and adjustment at the time of replacement is facilitated.

The alignment light source 23 includes a lamp light source having a wavelength distribution of a broad wavelength bandwidth (wide wavelength bandwidth) in order to generate illumination light including a plurality of wavelengths. Moreover, the alignment light source 23 may include a long wavelength cut filter for blocking a long wavelength side of light generated by the lamp light source, and a short wavelength cut filter for blocking a short wavelength side of light generated by the lamp light source. The long wavelength cut filter and the short wavelength cut filter may be wavelength cut filters of which a transmission bandwidth continuously varies depending on the irradiation position. By using such wavelength cut filters, a particular wavelength can be transmitted therethrough.

The optical rod 33 is an example of an optical integrator, which bundles light discharged from the light sources 30a to 30g and causes the light to be incident on the optical rod 33. That is, the optical rod 33 can make a uniform spatial light intensity distribution of light emitted from the optical rod 33. In addition, a different optical integrator which can make a uniform distribution may be used. For example, a micro-lens array may be employed.

A combining method is not limited to combining using fibers (special fibers). For example, a method of combining rays of light having different wavelengths using a dichroic mirror may be adopted, or combining may be performed using a polarization beam splitter, a half mirror, or the like. The combining method can be suitably selected in consideration of a space for a disposition place, a wavelength of a semiconductor laser, component costs, and the like.

Light emitted from the optical rod 33 passes through an ND filter 34, and thus the intensity may be adjusted (adjustment of the amount of light). The ND filter 34 is an element capable of adjusting the light intensity which passes therethrough. For example, the transmittance thereof can be adjusted by means of the kind or the film thickness of a metal film applied to quartz. Regarding the ND filter 34, for example, a plurality of kinds of different filters having transmittances different from each other may be prepared in order to adjust the amount of light for the alignment light source 23, and the plurality of filters may be inserted into the optical path in a manner of being switchable in accordance with the necessary amount of light. Alternatively, the ND filter 34 may be a filter of which the transmittance continuously varies depending on the position through which light is transmitted. In this case, the transmittance may be adjusted depending on the position of the ND filter 34 with respect to the optical path. In addition, the light intensity generated by each of the light sources 30a to 30g can be adjusted, for example, using a current individually supplied to the light sources 30a to 30g. Moreover, the light intensity generated by each of the light sources 30a to 30g may be adjusted by adjusting the position of the ND filter 34 and may be adjusted by means of a combination of both.

Light emitted from the ND filter 34 passes through a diffusion plate 35, and a fiber 36 is irradiated with the light. If semiconductor lasers are employed as all or some of the light sources 30a to 30g, the wavelength bandwidths of light generated by the semiconductor lasers are narrow (several nm). Therefore, noise (speckle noise) may be generated in an observed image due to interference. Here, observed speckle noise can be decreased by rotating the diffusion plate 35 to temporally change the state of a waveform. If measurement accuracy in the order of several nm is necessary, it is desirable that speckle noise be removed by constituting the diffusion plate 35 in a rotatable manner. In addition, a method for driving the diffusion plate 35 is not limited to rotation, and the diffusion plate 35 may be subjected to shift movement or driven in an optical axis direction in accordance with an installation space of the diffusion plate 35.

Figure 5:
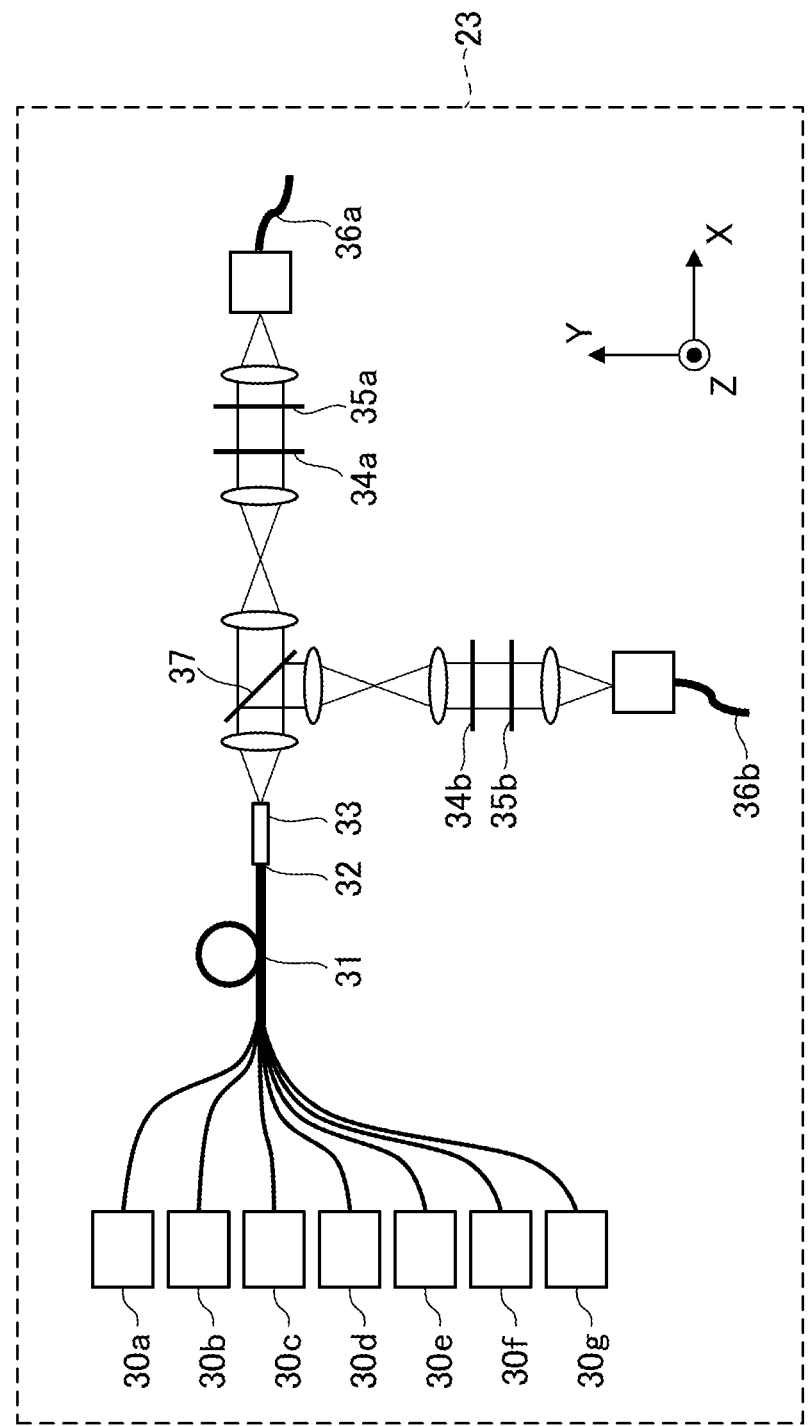
FIG. 5 is a view illustrating an example of a constitution of the alignment light source.

FIG. 5 is a view illustrating an example of a constitution of the alignment light source 23. Light emitted from the fiber 36 is emitted from the alignment light source 23 as illumination light. In the example in FIG. 1, there is one fiber. However, as illustrated in FIG. 5, a half mirror 37 may be disposed in the optical path in a divided (branching) manner, and thus illumination light for two axes can be obtained by causing rays of light to be respectively incident on fibers 36a and 36b. In addition, illumination light for a plurality of axes can be obtained without being limited to two axes by changing the number of divisions (the number of branches). A method for dividing light (method for branching light) is not limited to a half mirror, and a beam of light may be partially divided by disposing a mirror.

Figure 6:
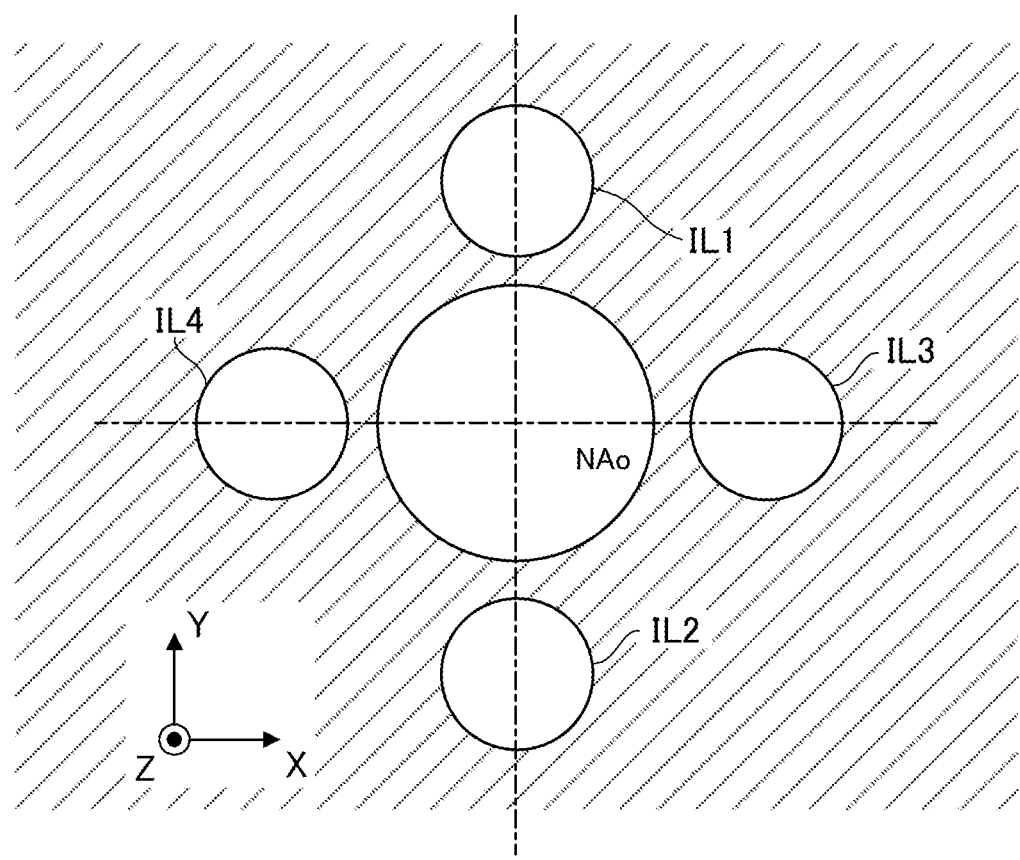
FIG. 6 is a view illustrating a pupil distribution of the measurement optical system according to Example 1.

FIG. 6 is a view illustrating a relationship between a pupil intensity distribution (IL1 to IL4) of the illumination optical system 22 of the measurement optical system 3 and an numerical aperture NAO of the detection optical system 21. In Example 1, the pupil intensity distribution of the illumination optical system 22 includes a first pole IL1, a second pole IL2, a third pole IL3, and a fourth pole IL4. The illumination optical system 22 may illuminate the mold mark 10 or the wafer mark 11 with light incident in a direction perpendicular to a direction in which the pattern of the mold mark 10 or the wafer mark 11 is arranged in an XY plane (first direction) and light incident parallel to the foregoing direction. As described above, a plurality of poles, that is, the first pole IL1 to the fourth pole IL4 can be formed from one alignment light source 23 by disposing the reflection film 24a functioning as the opening diaphragm on the pupil surface of the illumination optical system 22 and blocking unnecessary light. In this manner, if a pupil intensity distribution having a plurality of poles is formed, there is no need to provide a plurality of light sources. Therefore, the measurement optical system 3 can be simplified or miniaturized.

FIG. 7 is a view illustrating an example of an alignment mark generating a moire fringe. Hereinafter, with reference to FIGS. 7A to 7D, a principle of generation of a moire due to diffracted light from the mold mark 10 and the wafer mark 11 and detection of the relative positions of the mold mark 10 and the wafer mark 11 using a moire will be described. As illustrated in FIG. 7, the diffraction grating (first diffraction grating) 41 provided in the mold 7 as the mold mark 10 and the diffraction grating (second diffraction grating) 42 provided in the wafer 8 as the wafer mark 11 have slightly different regularities of patterns (gratings) in a measurement direction. If such two diffraction gratings having regularities of gratings different from each other are overlaid, a pattern having a regularity reflecting a regularity difference between the diffraction gratings, that is, a so-called moire (moire fringe) is manifested due to interference between rays of diffracted light from the two diffraction gratings. At this time, the phase of the moire varies depending on the relative positions of the diffraction gratings. Therefore, the relative positions of the mold mark 10 and the wafer mark 11, that is, the relative positions of the mold 7 and the wafer 8 can be obtained by detecting the moire.

Figure 7A:
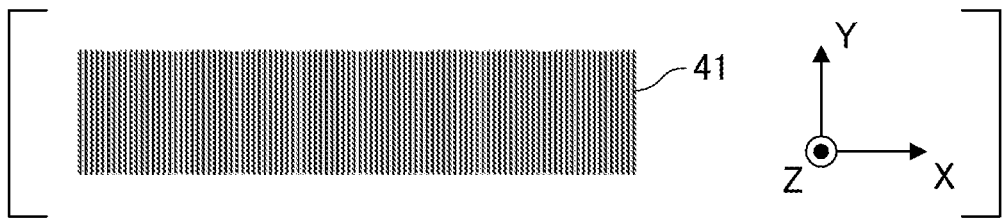
FIGS. 7A to 7D are views illustrating alignment marks generating a moire fringe.
Figure 7B:
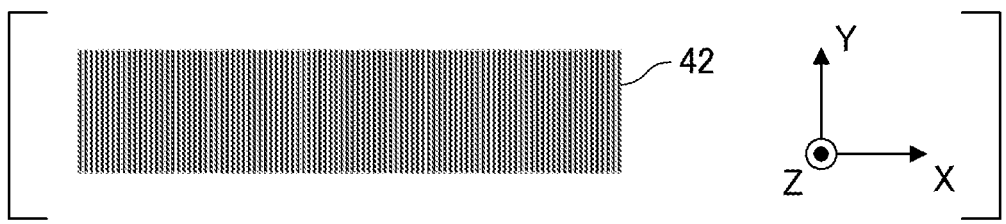
Figure 7C:
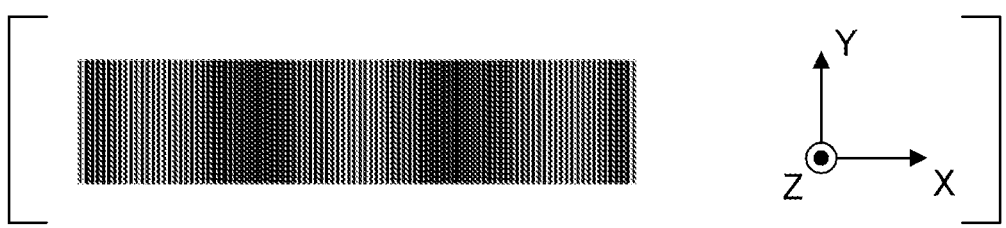
Figure 7D:
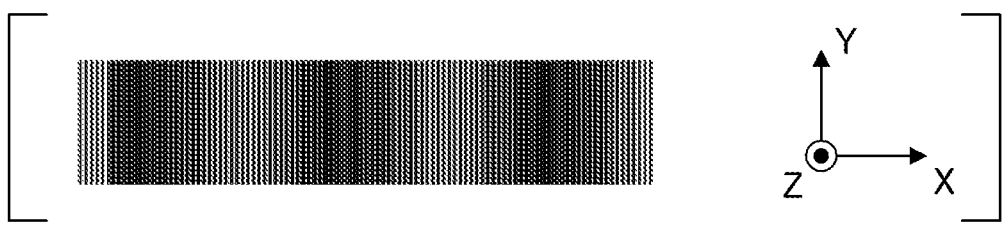

Specifically, if the diffraction grating 41 and the diffraction grating 42 having slightly different regularities are overlaid, rays of diffracted light from the diffraction gratings 41 and 42 are overlaid. Therefore, as illustrated in FIG. 7C, a moire having a regularity reflecting the difference between the regularities is generated. In a moire, positions of light and shade (phases of fringes) vary depending on the relative positions of the diffraction grating 41 and the diffraction grating 42. For example, if one diffraction grating of the diffraction gratings 41 and 42 is deviated in an X direction, the moire illustrated in FIG. 7C changes into the moire illustrated in FIG. 7D. A moire enlarges the amount of actual positional deviation between the diffraction grating 41 and the diffraction grating 42 and is generated as a fringe having a large regularity. Therefore, even if the detection optical system 21 has a low resolution, the relative positions of the diffraction grating 41 and the diffraction grating 42 can be detected with high accuracy.

Figure 8A:
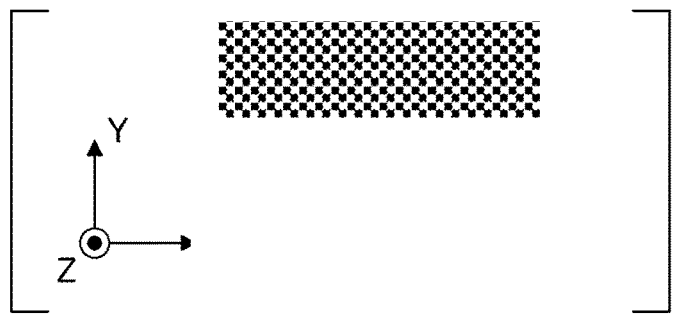
FIGS. 8A to 8D are views illustrating alignment marks according to Example 1.
Figure 8B:
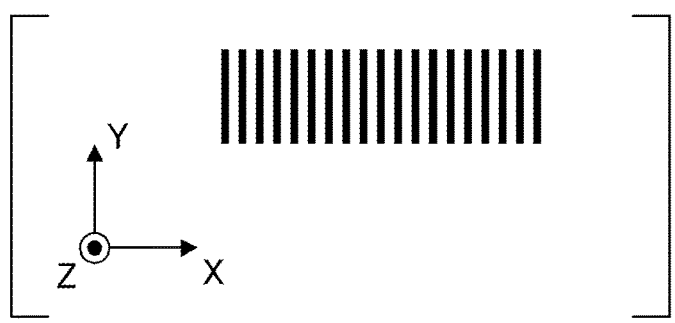

If the diffraction gratings 41 and 42 are detected in a bright visual field in order to detect a moire, the detection optical system 21 also detects zero-order light from the diffraction gratings 41 and 42. A case in which the diffraction gratings 41 and 42 are detected in a bright visual field may include a case in which the diffraction gratings 41 and 42 are illuminated in a perpendicular direction and diffracted light diffracted in the perpendicular direction by the diffraction gratings 41 and 42 is detected. Zero-order light may cause deterioration in contrast of a moire. Therefore, it is desirable that the measurement optical system 3 have a constitution of a dark visual field detecting no zero-order light (that is, the diffraction gratings 41 and 42 are illuminated in an obliquely incident manner). FIG. 8 is a view illustrating an example of a mark for alignment (alignment mark). In Example 1, in order to be able to detect a moire even in a constitution of a dark visual field, one diffraction grating of the diffraction gratings 41 and 42 is set as a checkerboard-shaped diffraction grating as illustrated in FIG. 8A, and the other diffraction grating is set as a diffraction grating as illustrated in FIG. 8B. The diffraction grating illustrated in FIG. 8B includes a pattern regularly arranged in the measurement direction (first direction), and a pattern regularly arranged in a direction orthogonal to the measurement direction (second direction).

In the constitutions in FIGS. 6, 8A, and 8B, light from the first pole IL1 and the second pole IL2 is used for irradiating (is incident on) the diffraction grating, diffracted in a Y direction by the checkerboard-shaped diffraction grating, and also diffracted in the X direction. Moreover, light diffracted in the X direction due to the diffraction grating having a slightly different regularity is incident on a detection region (NAo) on the pupil of the detection optical system 21 with information of the relative positions in the X direction and detected by the image capturing element 25. The relative positions of the two diffraction gratings can be obtained using this.

Figure 8C:
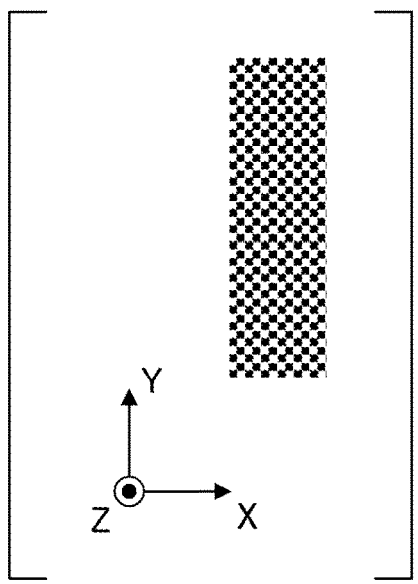
Figure 8D:
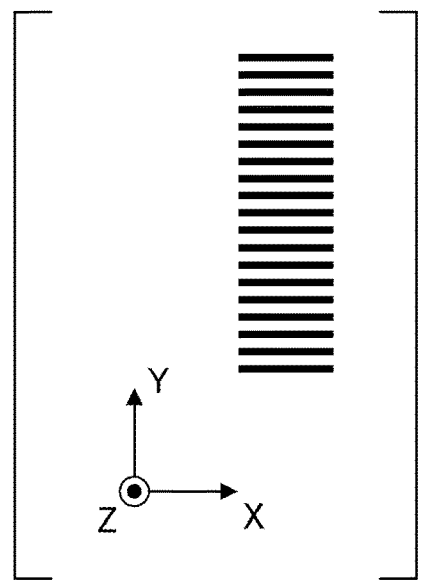

Regarding the relationship between the pupil intensity distribution illustrated in FIG. 6 and the diffraction gratings illustrated in FIGS. 8A and 8B, light from the third pole IL3 and the fourth pole IL4 is not used for detecting the relative positions of the diffraction gratings. However, if the relative positions of the diffraction gratings illustrated in FIGS. 8C and 8D are detected, light from the third pole IL3 and the fourth pole IL4 is used for detecting the relative positions of the diffraction gratings, and light from the first pole IL1 and the second pole IL2 is not used for detecting the relative positions of the diffraction gratings. In addition, if the pair of the diffraction gratings illustrated in FIGS. 8A and 8B and the pair of the diffraction gratings illustrated in FIGS. 8C and 8D are disposed within the same visual field of the detection optical system 21 and the relative positions in two directions are detected at the same time, the pupil intensity distribution illustrated in FIG. 6 is extremely effective.

Figure 9A:
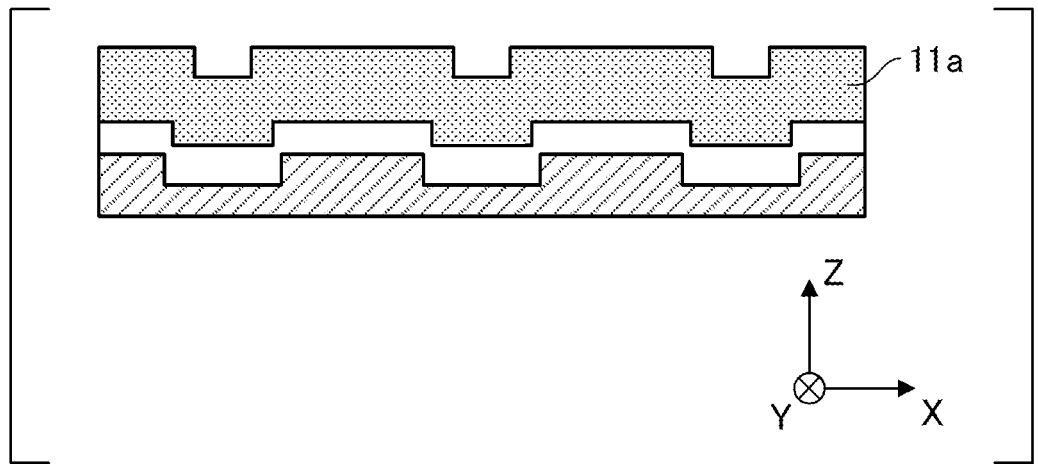
FIGS. 9A and 9B illustrate shapes of cross sections of patterns according to Example 1.
Figure 9B:
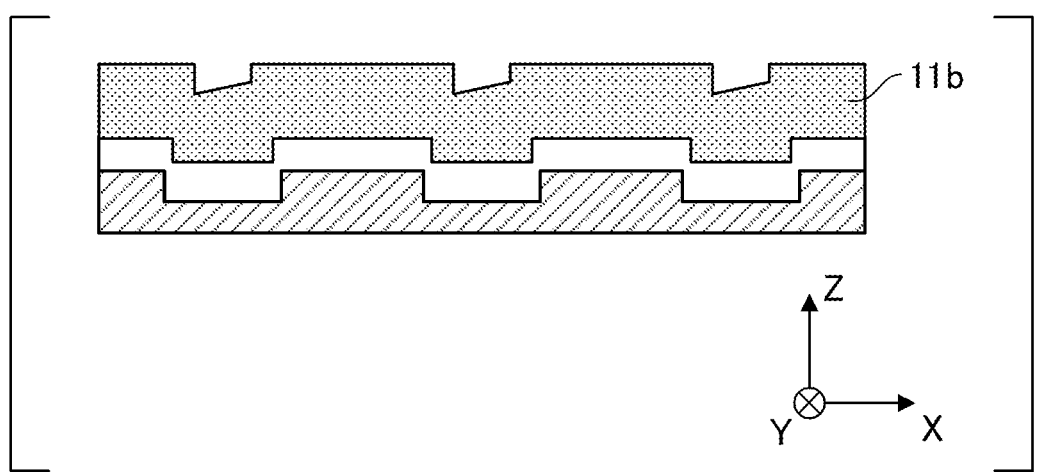

FIG. 9 is a view illustrating an example of a cross-sectional shape of the pattern of the mold 7. Hereinafter, with reference to FIGS. 9A and 9B, a structure of a cross section of a mark (detection target) will be described as an example. The mark of a model illustrated in FIG. 9 has a structure constituted of three layers. Since these layers have steps, diffraction of light occurs due to the steps when it is irradiated with light. For this reason, it may be recognized as a mark. A mark 11a illustrated in FIG. 9A is a mark in a state of having no shape error (manufacturing error). A mark 11b illustrated in FIG. 9B is a mark in a state of having a shape error. The mark 11b illustrated in FIG. 9B is a mark having an asymmetric shape error (manufacturing error). Since the mark 11a has a symmetric structure having no steps or the like, diffracted light has an ideal diffraction angle. For this reason, a mark position to be measured has no error with respect to an actual position. However, since the mark 11b has an asymmetric shape error, the diffraction angle of diffracted light deviates from an ideal state as much as the asymmetric portion. For this reason, the mark position to be measured has an error (amount of shift) with respect to an actual position. If this error is significant, there is a possibility that overlay accuracy between layers (each layer) of the wafer may deteriorate, thereby causing a manufacturing flaw.

Figure 10A:
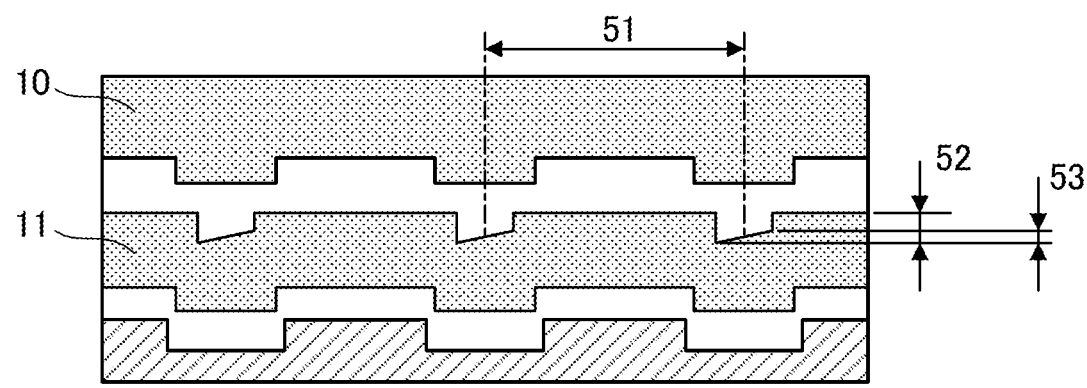
FIGS. 10A and 10B illustrate a simulation model and a result thereof according to Example 1.
Figure 10B:
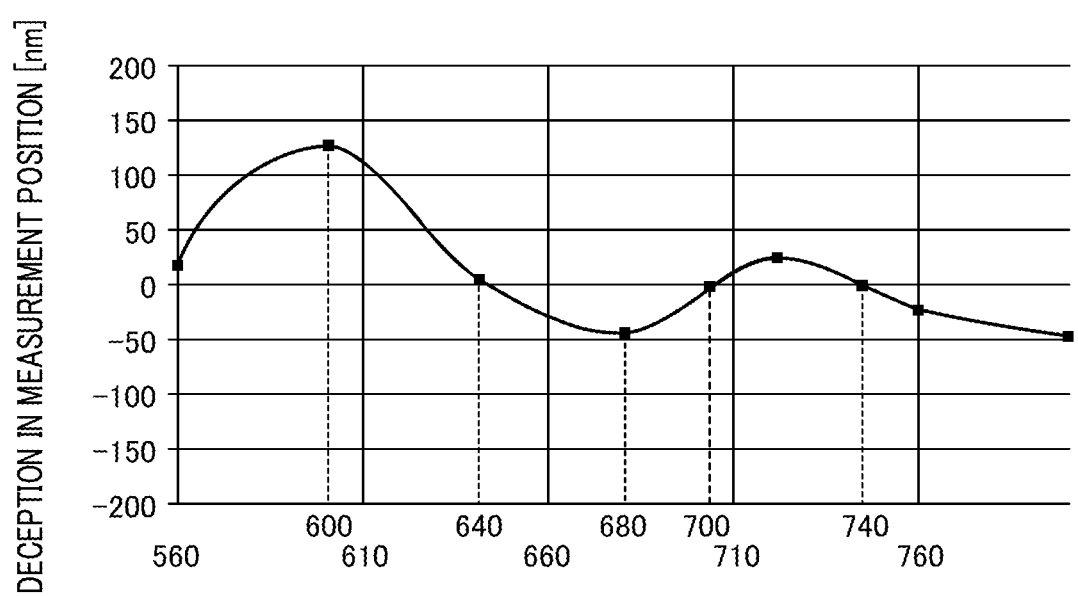

FIG. 10 is a view illustrating an example of a simulation model and a result thereof according to Example 1. Hereinafter, with reference to FIGS. 10A and 10B, a relationship between the wavelength of illumination light of the position measurement apparatus and a measurement error in the position measurement apparatus will be described as an example. FIG. 10A illustrates an example of a schematic view (a cross-sectional shape of the mold mark 10 and the wafer mark 11) of a simulation model. Moreover, FIG. 10A illustrates a state during imprint processing with respect to the resin 9. FIG. 10B illustrates an example of a simulation result based on the schematic view illustrated in FIG. 10A as an example. Through this simulation, a measurement value (wavelength characteristics) indicating a relationship between a wavelength of illumination light of the position measurement apparatus and a measurement error in the position measurement apparatus can be obtained. Here, a measurement error in the position measurement apparatus is a measurement error occurring due to the wafer mark 11 having an asymmetric shape.

In the simulation illustrated in FIG. 10, the wafer mark 11 is constituted to have a regular pattern, and the measurement value is calculated while a step 52 of the regular pattern is 200 nm and a pitch 51 is 1,000 nm, whereas the amount of error 53 of the shape is 40 nm. Here, regarding the material of each layer, a base material of the wafer 8 is constituted of a silicon substrate, and the wafer mark 11 is constituted of $SiO_2$. A part on the wafer mark 11 is coated with the resin 9, and the mold 7 is disposed with this resin 9 therebetween.

In the graph of the simulation result illustrated in FIG. 10B, the horizontal axis indicates the wavelength for illumination performed by the position measurement apparatus, and the vertical axis indicates the amount of measurement error (deception in measurement position) caused by the wafer mark 11 having processing asymmetry. Further, in FIG. 10B, the measurement values that are results individually obtained through simulation with the wavelengths are depicted in an approximate curve. Moreover, as illustrated in the approximate curve in FIG. 10B, it can be seen that the amount of measurement error varies depending on each of the wavelengths and it repeatedly increases and decreases. For this reason, a measurement error can be reduced by selecting a plurality (at least two or more kinds) of wavelength to be used for alignment. The simulation model illustrated in FIGS. 10A and 10B is an example. However, a measurement error in the position measurement apparatus varies depending on the wavelength. That is, if there is an error having an asymmetric shape in the wafer mark 11, the measurement value regularly shifts depending on the wavelength. In addition, this simulation is performed in a dark visual field. However, a measurement error in the position measurement apparatus varies depending on the wavelength of illumination light even if simulation is performed in a bright visual field.

Figure 11:
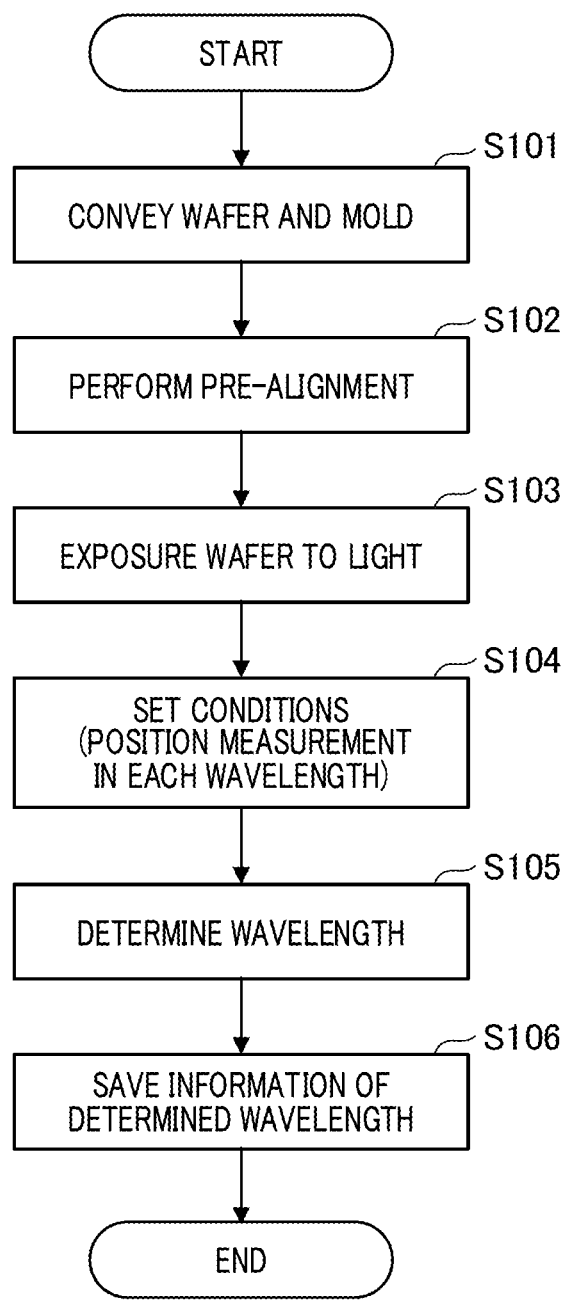
FIG. 11 is an operation sequence diagram of the imprint apparatus according to Example 1.

FIG. 11 is a flowchart illustrating an operation sequence of the imprint apparatus 1 including the position measurement apparatus according to Example 1. Hereinafter, with reference to FIG. 11, a method of determining an optimum wavelength by independently changing the light intensity ratio between at least wavelengths of two or more kinds constituting illumination light from the alignment light source 23 according to Example 1 will be described. Operation of the imprint apparatus 1 including the position measurement apparatus in FIG. 11 is controlled by the control unit 12 (control unit) executing a computer program.

First, in Step S101, the wafer (substrate used for manufacturing an article) 8 having a laminated structure used for production and the mold 7 are conveyed into the imprint apparatus and held by the wafer holding portion thereafter. Moreover, in Step S101, the mold 7 for manufacturing an article is conveyed to the mold holding unit 4 by a driving mechanism of the mold holding unit 4 and held by the mold holding unit 4. Next, in Step S102, the pattern forming region of the wafer 8 and a pattern region of the mold 7 are pre-aligned. For example, pre-alignment may be performed by the position measurement apparatus measuring the relative positions of the mold mark 10 and the wafer mark 11. Next, in Step S103, the resin 9 (an imprint material or a resist) is used for coating (is disposed in) the pattern forming region of the wafer 8 by the coating unit 6. Further, any one of the driving mechanism of the mold holding unit 4 or the wafer stage 5 is driven such that the mold 7 comes into contact with the resin 9 on the wafer 8, and a predetermined pattern of the mold 7 is brought into contact with the resin 9 on the wafer 8. Thereafter, the wafer 8 is exposed to (illuminated with) light to cure the resin 9.

Next, in Step S104, in a state in which the predetermined pattern of the mold 7 and the resin 9 are brought into contact with each other, conditions for an optimum wavelength are set. Specifically, the control unit 12 controls the alignment light source 23 such that the wafer 8 is illuminated with each of rays of illumination light having a plurality of wavelengths and switches between a plurality of wavelengths. Further, the conditions for a plurality of wavelengths, that is, the relative positions of the mold mark 10 and the wafer mark 11 are measured using each of the rays of illumination light having wavelengths, and information of the relative positions is acquired. The control unit 12 obtains a measurement value on the basis of the information of the relative positions obtained by the position measurement apparatus regarding each of rays of illumination light having the plurality of wavelengths. The measurement value is data indicating a relationship between the wavelength of illumination light and a measurement error in the position measurement apparatus and is similar to the measurement value illustrated in FIG. 10B as an example.

Next, in Step S105, the control unit 12 determines an optimum wavelength (illumination condition) for the alignment light source 23 of the position measurement apparatus when an article is manufactured using the mold 7 on the basis of the measurement value obtained in Step S104. An optimum wavelength is an intensity of each of rays of light having a plurality of wavelengths constituting illumination light generated by the alignment light source 23. The wafer mark 11 has an asymmetric shape varying depending on the position due to a manufacturing error. Further, hence, a measurement error measured by the position measurement apparatus varies depending on the position of the wafer 8. The foregoing optimum wavelength is determined such that this measurement error is reduced (decreased). A method for determining this optimum wavelength will be described below. Next, in Step S106, the control unit 12 saves the information of an optimum wavelength of Step S105 in a storage unit (not illustrated). Accordingly, when an article is manufactured using the mold 7, a measurement error in the position measurement apparatus caused by the wafer mark 11 having an asymmetric shape due to a manufacturing error can be decreased, and the relative positions of the mold mark 10 and the wafer mark 11 (positional information) can be obtained.

Here, a method for setting conditions of an optimum wavelength in Step S104 will be described in detail. At the time of setting conditions, the relative positions of the mold mark 10 and the wafer mark 11 are measured for each of the plurality of wavelengths. First, a case in which the alignment light source 23 is a semiconductor laser will be described below as an example. In this case, the wavelength can be switched by turning on and off a current value of the semiconductor laser of a particular wavelength. Since a rising time of a semiconductor laser before stable oscillation is within several seconds, which is fast, there is a small delay in measurement time even if the semiconductor laser is repeatedly turned on and off. Therefore, the processing of Step S104 can be completed within a short period time. In addition, a particular wavelength may be blocked using a shutter without turning on and off the semiconductor laser.

Next, a case in which the alignment light source 23 is a lamp will be described below as an example. In this case, a broad wavelength bandwidth (wide wavelength bandwidth) is adopted, it is advantageous to use a wavelength cut filter. For example, a light source of a desired wavelength bandwidth can be obtained by changing a combination of a short wavelength cut filter and a long wavelength cut filter. In addition, the wavelength of illumination light generated by the alignment light source 23 can be minutely controlled by using a wavelength cut filter of which the transmission bandwidth continuously changes depending on the incident position of light. Moreover, a lamp light source of a broad wavelength bandwidth of 200 nm or greater is used as the alignment light source 23, and a sensor (RGB sensor) capable of detecting colors (RGB) is used as the image capturing element 25. In this case, light of each wavelength can be detected at one time without switching the wavelength of the alignment light source 23. Accordingly, a time necessary for measurement can be shortened. In a general RGB sensor, there are three wavelengths (red, green, and blue) which can be measured. In addition, the image capturing element 25 may have an RGB color filter.

Next, a case in which a semiconductor laser is used as the alignment light source 23 and an RGB sensor is used as the image capturing element 25 will be described below as an example. In this case, the measurement time can be shortened by detecting the wavelength of the semiconductor laser for each of the RGB band widths in a mixed manner. For example, a case in which sensitivities of the image capturing element 25 of the RGB sensor are R: 590 to 720 nm, G: 480 to 600 nm, and B: 400 to 540 nm will be considered. In this case, the wavelength of the semiconductor laser generates light of a wavelength bandwidth within a range of 400 to 480 nm, and this can be detected by a B pixel (a pixel having a filter allowing light of the B bandwidth to pass therethrough). In addition, light of a wavelength bandwidth within 540 to 590 nm is generated, and this can be detected by a G pixel (a pixel having a filter allowing light of the G bandwidth to pass therethrough). In addition, light of a wavelength bandwidth within a range of 600 to 720 nm is generated, and this can be detected by an R pixel (a pixel having a filter allowing light of the R bandwidth to pass therethrough). Since one wavelength can be measured from each wavelength, one wavelength from each bandwidth, that is, three wavelengths in total can be measured. Accordingly, it is possible to shorten a time necessary for position measurement in which the wavelength for setting conditions of an optimum wavelength in Step S104 is switched.

In addition, regarding a method for shortening a time necessary for determining an optimum wavelength, data is acquired and interpolated by selecting a part from the wavelengths of the light source constituted as the alignment light source 23, and thus a measurement error in all the wavelengths of the alignment light source 23 can be estimated. Regarding a method for interpolation, there is a method for performing fitting based on the results obtained by a simulation on the basis of a model having a structure similar to that of the wafer 8. For example, if a simulation result as in FIG. 10B is obtained, a function approximating FIG. 10B is calculated, and a coefficient can be subjected to fitting using actually measured data which having the function as an initial function of a fitting function. Accordingly, a graph having a tendency equivalent to that of the simulation result can be made. Moreover, a measurement error in the wavelength which has not been actually measured is calculated from the graph. In addition, there is also a method for performing fitting by setting an initial fitting function on the basis of actually measured results under similar process conditions in the past without using the simulation result. Accordingly, even if the number of measurement points is reduced, an error with respect to an actual measurement value can be reduced.

In addition, the measurement value may be acquired through a simulation as illustrated in FIG. 10. A simulation may be executed by the control unit 12 or may be executed utilizing a computer connected to the control unit 12. In a simulation, it should be considered that there is occurrence of a gap (unevenness) between a measurement value obtained through a simulation and an actual measurement value if an asymmetric shape of a mark varies. Such a gap may cause an error in the positional information detected under the illumination condition determined on the basis of the measurement value. Here, regarding a method for decreasing an error occurring due to such a cause, there is a method for performing a simulation of an asymmetric shape expected in a laminated structure with a plurality of models. For example, regarding a plurality of models, there may be models in which the amounts of thickness or inclination of substances to be laminated are different from each other. Next, the sensitivity of a measurement error with respect to a shape error in each wavelength is obtained from the simulation results of the plurality of models. The measurement results (sensitivity for deception of the measurement position) of a plurality of models having an asymmetric shape are added together, and a plurality of wavelengths having low sensitivity with respect to a shape error is selected and used as a wavelength for detection. Accordingly, alignment advantageous for an asymmetric shape error can be performed on the average in the plurality of models having an asymmetric shape used for calculation.

In addition, FIG. 10B is an example of a result in which a simulation is performed on the premise that there is no alignment error (an alignment error between the mold 7 and the wafer 8) for a simulation. Thus, measurement error=0 nm denotes alignment error=0. In addition, in actual measurement, a measurement error occurs in the relative position obtained through pre-alignment in Step S102 due to the asymmetric shape of the wafer mark 11. Therefore, an alignment error may also be present between the pattern forming region of the wafer 8 and the mold 7 aligned on the basis of the relative positions of the mold mark 10 and the wafer mark 11 detected by the position measurement apparatus. If an alignment error is present, when the relative positions of the mold mark 10 and the wafer mark 11 are detected using a plurality of wavelengths in this state, it is possible to obtain a result in which an offset amount corresponding to an alignment error is added to the graph in FIG. 10B.

Here, in order to obtain an offset amount from the result (actually measured value) measured by the position measurement apparatus, there is a need to know correct relative positions (alignment error) of the mold mark 10 and the wafer mark 11. For this reason, an overlay state of the wafer 8 after imprint is inspected using an inspection apparatus (evaluation apparatus) such as an overlay inspection apparatus, and an overlay error is measured and acquired. The amount of error acquired at this time is used as an overlay error in the mold 7 and the wafer 8 in pre-alignment, and the amount of measurement error obtained through position measurement at the time of Step 104 is evaluated. The control unit 12 acquires the measurement value having a corrected offset amount on the basis of the measurement value obtained by the foregoing method and the overlay error obtained using the overlay inspection apparatus or the like. The corrected measurement value may be equivalent to that of the simulation result if the simulation result illustrated in FIG. 10B is correct. That is, a position where the measurement error in FIG. 10B is 0 nm becomes a result measured by the overlay inspection apparatus.

For example, if an imprint operation in Step S103 is performed at positions where the mold 7 and the wafer 8 have deviated by 100 nm, the position of measurement error=0 nm illustrated in FIG. 10B is measured as a position which is actually offset by 100 nm. If the wafer 8 is measured (evaluated) by the overlay inspection apparatus or the like, an overlay error in the wafer 8 is measured to be 100 nm. After this measurement, the measured value is input to the computer inside the apparatus as an overlay error during the pre-alignment in Step S102. Then, this is removed and evaluation is performed.

Next, a method for determining an optimum wavelength on the basis of the evaluation in Step S105 will be described below. As the measurement value illustrated in FIG. 10B as an example, a measurement error varies depending on the wavelength of illumination light. The control unit 12 determines the illumination condition for the alignment light source 23 of the position measurement apparatus such that a measurement error in the position measurement apparatus (an error in positional information detected by the position measurement apparatus) decreases. Specifically, the intensity of each of rays of light having a plurality of wavelengths constituting illumination light generated by the alignment light source 23 is determined by adjusting the ratio. Here, the alignment light source 23 may be constituted such that the intensity of each of rays of light having a plurality of wavelengths can be adjusted to the light intensities of at least two wavelengths. The alignment light source 23 may be constituted such that the intensity can be continuously adjusted for at least one of rays of light having a plurality of wavelengths. As an example, the control unit 12 determines weighting of light of rays of light having a plurality of wavelengths constituting illumination light generated in the alignment light source 23. Here, for example, the number of a plurality of wavelengths of light constituting illumination light is referred to as n, the respective wavelengths are referred to as $\lambda 1$, $\lambda 2$, and so on to $\lambda n$, measurement errors using the respective wavelengths are referred to as m1, m2, and so on to mn, and the coefficients of weighing are referred to as k1, k2, and so on to kn. The measurement error m after weighting is expressed by the following expression (1).

$$m = k1 \times m1 + k2 \times m2 + \text{and so on to} + kn \times mn \quad (1)$$

In the foregoing Expression (1), k1+k2+ and so on to+kn=1 is established.

The control unit 12 determines the values k1 to kn such that m=0 is established in the foregoing Expression (1). The measurement error due to the wavelength can be eliminated by combining (adding) the rays of light of the wavelengths $\lambda 1$ to $\lambda n$ at the determined ratios k1 to kn. If all the signs of the measurement errors m1 to mn are the same as each other, the measurement error m cannot be set to zero by adding them together. For this reason, there is a need for a particular measurement error to be offset, recorded, and removed from the measurement error.

Here, if there is the wavelength $\lambda m$ of zero in any of the measurement errors m1 to mn, the control unit 12 sets 1 in the coefficient km of the wavelength and sets zero in other coefficients, and thus the measurement error due to the wavelength can be eliminated. However, as illustrated in FIG. 10B, since the wavelength in which the measurement error becomes zero is a wavelength of which the change amount (differential value) increases, it is assumed that the sensitivity with respect to a shape error becomes high. For this reason, if the position measurement apparatus performs alignment of one wafer using illumination light constituted of only rays of light of the same wavelength, if there is unevenness in a shape error for each pattern forming region of the wafer 8, the measurement error for each pattern forming region may become significant.

Here, the control unit 12 performs weighting by a method as follows. First, the control unit 12 calculates the sensitivity of the measurement error with respect to the wavelength. Next, the control unit 12 preferentially selects (uses) a wavelength having low sensitivity. Next, the control unit 12 selects wavelengths of at least two kinds having different signs in the measurement errors m1 to mn. When wavelengths are selected, wavelengths of which the signs of the measurement error are different from each other may be selected. At this time, if the amount of light is insufficient, the control unit 12 can increase the amount of light by mixing and using wavelengths of three or more kinds. Moreover, a wavelength of at least one kind may be selected. In addition, the control unit 12 adjusts and changes the light intensity ratio (ratio of the amount of light) of each wavelength such that a mark can be measured in terms of balance with respect to the amount of light of other marks measured at the same time.

Figure 12:
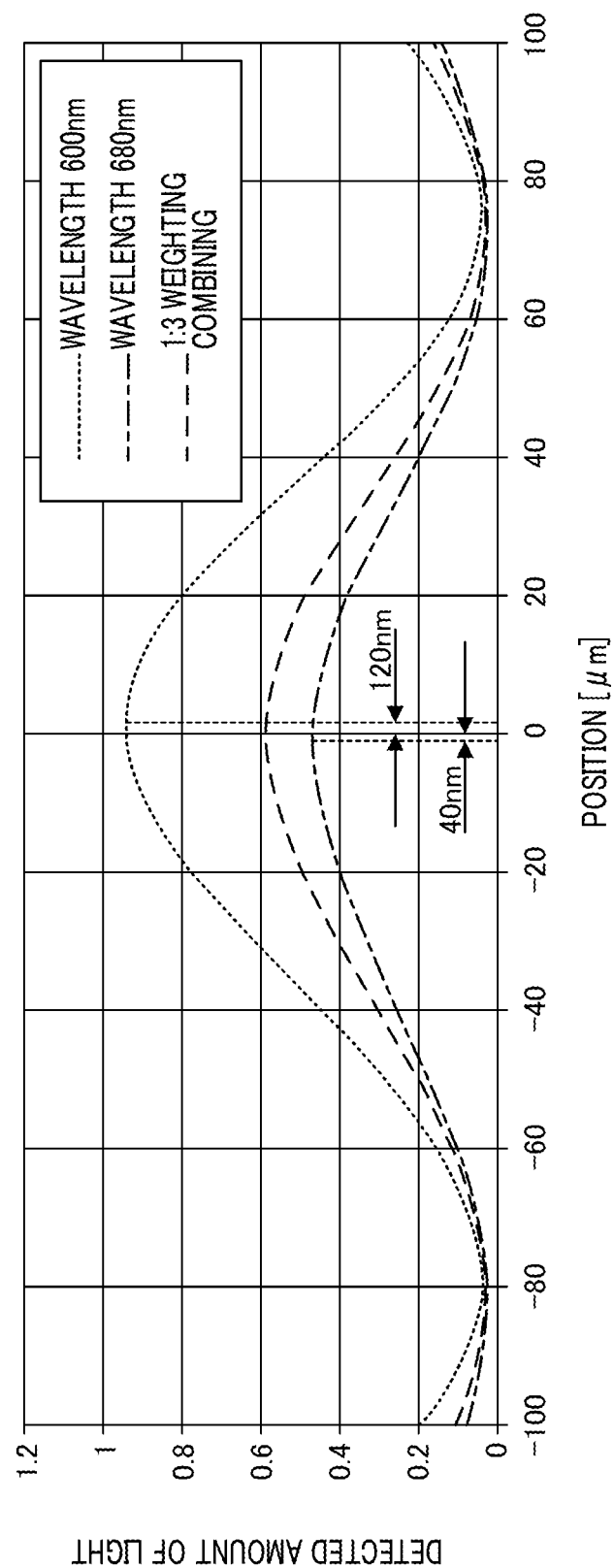
FIG. 12 is a view illustrating shift of a mark position according to Example 1.

A method for determining an optimum wavelength on the basis of the evaluation in FIG. 11, specifically, a method for determining the intensity of each of rays of light having a plurality of wavelengths constituting illumination light generated by the alignment light source 23 on the basis of the measurement value illustrated in FIG. 10B as an example will be described below. Here, as an example, it is assumed that illumination light is generated by combining a wavelength of 600 nm and a wavelength of 680 nm at a light amount ratio of 1:3 on the basis of the wavelength characteristics illustrated in FIG. 10B as an example. As an example, FIG. 12 illustrates a waveform obtained by a sensor of the position measurement apparatus when the mold mark 10 and the wafer mark 11 are illuminated with illumination light obtained by combining rays of light of a wavelength of 600 nm and a wavelength of 680 nm at a light amount ratio of 1:3. At this time, the waveform is a measurement waveform of a moire fringe obtained by slicing an image along a line parallel to the measurement direction. In FIG. 12, the vertical axis indicates the amount of light, and the horizontal axis indicates the position on a sensor. Since a measurement error in a wavelength of 600 nm is 120 nm and a measurement error in a wavelength of 680 nm is −40 nm, if illumination light in which they are combined at the light amount ratio of 1:3 is used, the sum of the measurement errors becomes 0 nm (120 nm−40 nm×3). For this reason, there is no need to remove the offset portion. In addition, since the wavelengths of 600 nm and 680 nm are insensible to the change amount of the step 52, regardless of unevenness of the change amount of the step 52, measurement can be performed with high accuracy (relative positions of the mold mark 10 and the wafer mark 11).

Regarding a method for performing combining in consideration of the intensity ratio of the wavelengths of a plurality of rays of light, a case in which the alignment light source 23 is a plurality of semiconductor lasers will be described below as an example. In this case, a method for adjusting the amount of output light by adjusting the current value for driving each of the semiconductor lasers can be adopted. In addition, regarding another method, a method for disposing the ND filter 34 before combining the optical paths of the semiconductor lasers and changing the transmittance of the ND filter 34 can be adopted.

Figure 13A:
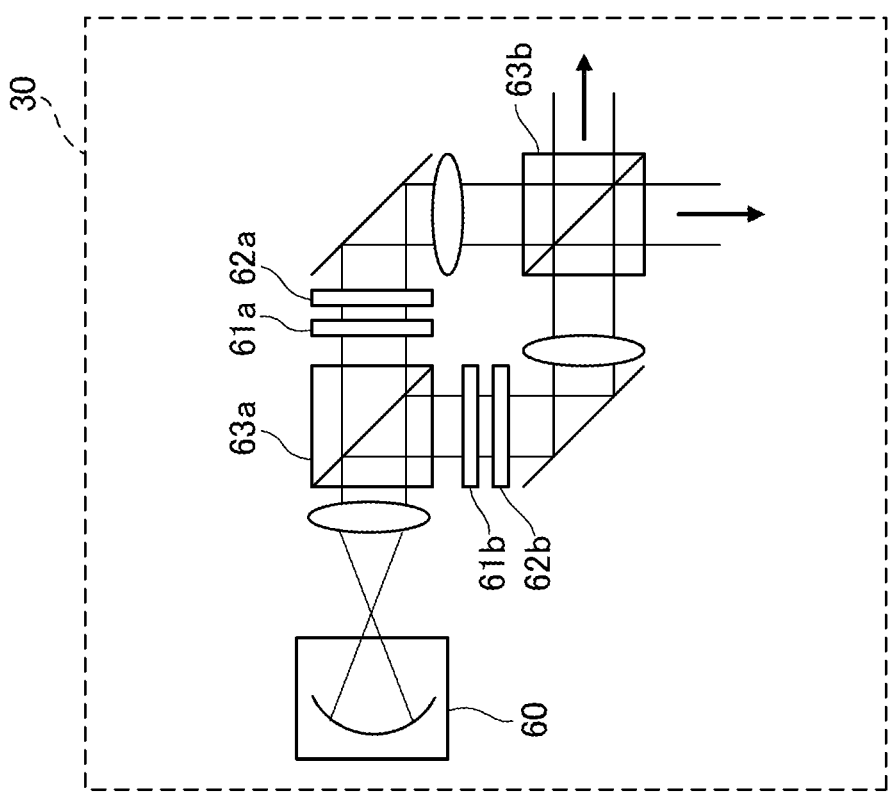
FIGS. 13A and 13B are views illustrating combining in a lamp light source according to Example 1.
Figure 13B:
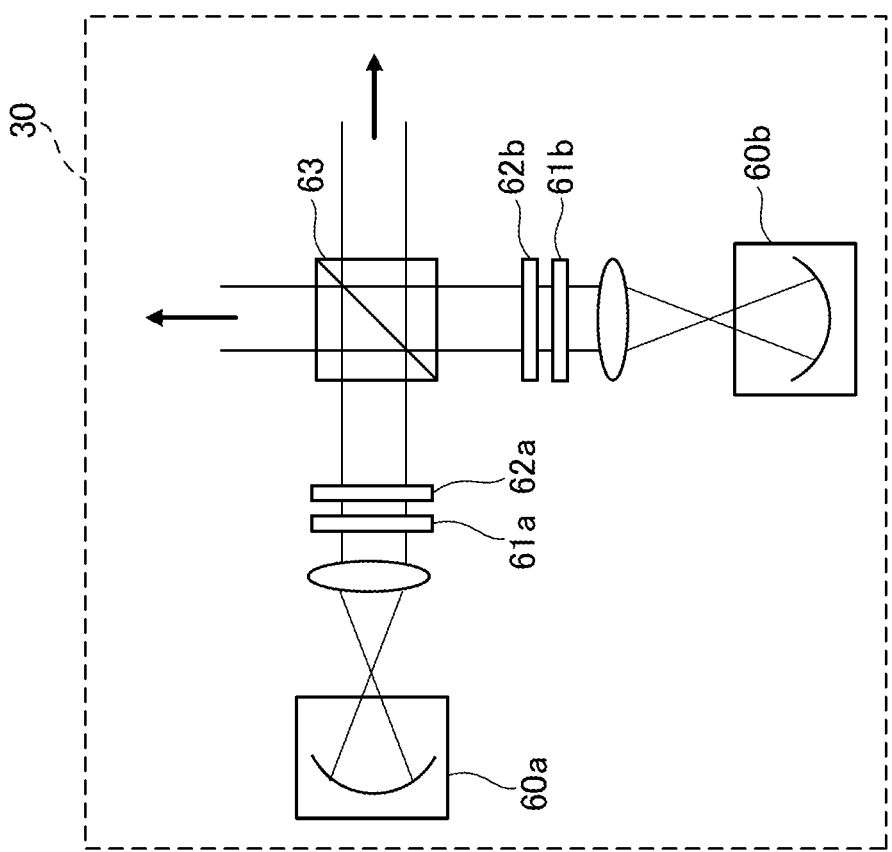

A case in which the alignment light source 23 is a light source such as a halogen lamp having a broad wavelength bandwidth will be described below as an example. In this case, it is difficult to take out and guide only a wavelength of 600 nm and a wavelength of 680 nm from one light source. Here, FIG. 13 illustrates an example of a constitution of the light sources 30 constituting the alignment light source 23. In the example in FIG. 13A, the alignment light source 23 includes lamps 60a and 60b (halogen lamps or the like), and short wavelength cut filters 61a and 61b include long wavelength cut filters 62a and 62b and a half mirror 63.

Rays of light from the lamps 60a and 60b respectively pass through the wavelength cut filters having different cut-off wavelengths and are combined by the half mirror 63. Accordingly, for example, when light having a wavelength of 600 nm is taken out from light generated by the lamp 60a and light having a wavelength of 680 nm is taken out from light generated by the lamp 60b, illumination light can be generated by combining the rays of light.

The amount of light of each wavelength may be adjusted by adjusting the voltage applied to the lamps 60a and 60b or by performing a method for disposing the ND filter 34 in the optical path before combining is performed. If the half mirror 63 is used, half the light from the lamps 60a and 60b is transmitted therethrough, and the remaining half is reflected. Therefore, it is efficient to supply as much light as two scopes. In the example in FIG. 13B, light from the lamp 60 (halogen lamp or the like) is separated by a half mirror 63a, and the wavelength cut filters 61a, 62a, 61b, and 62b are disposed in the respective optical paths. The ND filter 34 may be used for adjusting the amount of light of each wavelength. Rays of light modulated by the ND filter 34 are combined by a half mirror 63b, and thus illumination light may be generated.

In addition, a measurement error can be entirely reduced by selecting a wavelength range such that a measurement error becomes 0 nm when it is a broad wavelength bandwidth and is integrated. For example, in FIG. 10B, if the measurement error within a wavelength range of 610 nm to 700 nm is integrated, it becomes 0 nm. For this reason, if illumination light in such a range is used, an offset of the measurement error does not occur. In addition, since not only a wavelength of 640 nm having a measurement error sensible to the change amount of the step 52 but also an insensible wavelength is used, the sensitivity of a measurement error with respect to the change amount of the step 52 decreases.

Hereinafter, an example in which a light source having a broad wavelength bandwidth is used as the alignment light source 23 and a color (RGB) sensor is used as the image capturing element 25 will be described. In this case, positions of a moire fringe detected in wavelength bandwidths of R, G, and B can be detected. For this reason, position measurement from which a measurement error due to the wavelengths is removed can be performed by weighting and averaging the moire fringe positions detected in the wavelength bandwidths of R, G, and B on the sensor side without changing the wavelength bandwidth of the alignment light source 23. Specifically, the halogen lamp outputs light to the alignment light source 23 within a wavelength range of 400 to 720 nm. A case in which the sensitivity of the color (RGB) sensor of the image capturing element 25 is set to R: 590 to 720 nm. G: 480 to 600 nm, and B: 400 to 540 nm will be described. Since the halogen lamp has a broad wavelength bandwidth, the waveform is detected in the bandwidths of R, G, and B of the color (RGB) sensor of the image capturing element 25. Since the wavelengths are different from each other, the detected positions are different from each other. Further, a measurement error can be reduced by weighting and averaging the wavelength bandwidths of R, G, and B such that they become similar to the measurement results in the overlay inspection apparatus or the like. In addition, this method uses a result of a simulation. However, a measurement error can be reliably reduced using an actually measured value in each wavelength.

Here, an example using laser light sources (660 nm, 730 nm, and 760 nm) of wavelengths of three kinds (three regions) as the light sources (light emitting elements) 30 inside the alignment light source 23 will be described below. Regarding the kinds of wavelength of lasers, measurement can be performed with high accuracy when the wavelengths are dense, but the number of lasers may be determined in consideration of a space or costs for the alignment light source 23. In addition, regarding the kinds of lasers, since there is a difference between light emitting intensities due to the wavelengths, lasers satisfying the necessary amount of light may be selected. For example, if an output of 1 W or greater is necessary, there is limitation on the kinds of wavelength. The foregoing wavelengths (660 nm, 730 nm, and 760 nm) of three kinds have selected lasers which are small-sized and have a high output.

Compared to a method of cutting out wavelengths of three regions from the light sources such as halogen lamps having a broad wavelength bandwidth, when laser light sources are used, an output of light can be increased. For example, in the case of halogen lamps or metal halide lamps, since light spreads out from light emitting points, it is difficult to efficiently collect light in small regions of φ3 mm or smaller. In order to align a semiconductor wafer, there is a need to irradiate regions of φ3 mm or smaller on the wafer 8 with light and observe the mark positions. For this reason, light which cannot be collected in the mark regions on the wafer 8 cannot be used for measurement and becomes unnecessary light. That is, if halogen lamps or the like are used for collecting light in very small regions, efficiency deteriorates. If laser light sources are adopted, regions of φ1 mm or smaller can be irradiated with a high brightness. If the wafer mark 11 on the wafer 8 can be irradiated with a high brightness, even if the substances laminated on the wafer 8 are substance through which light is unlikely to be transmitted in a process, reflected light from the wafer mark 11 can be detected.

In addition, if the wavelength of the alignment light source 23 of one kind is adopted, the wavelength becomes a wavelength through which light is unlikely to be transmitted depending on the substances laminated on the wafer 8 or the thickness thereof, and there is a possibility that the wafer mark 11 on the wafer 8 may not be able to be detected. For this reason, lasers having wavelengths of three kinds are adopted. By combining and using rays of light from respective lasers, it is possible to reduce a probability that the wafer mark 11 may not be detected due to the laminated structure of the wafer 8.

A method for selecting an optimum wavelength if wavelengths of three kinds are used as described above will be described below based on a flowchart illustrating the operation sequence of the imprint apparatus 1 including the position measurement apparatus in FIG. 11. Here, compared to evaluation results obtained using an evaluation apparatus such as an overlay inspection apparatus, the measurement value obtained by performing measurement using the position measurement apparatus calculates differentials. The calculated differential values become measurement values varying depending on each of the wavelengths, as illustrated in FIG. 10B, in accordance with the conditions for the mold mark 10 and the wafer mark 11 to be measured.

Regarding the signs of the foregoing differential values obtained through measurement, if the sign of the measurement value of one wavelength in the wavelengths of three kinds is different from the signs of the measurement values obtained in the wavelengths of the two remaining kinds, weighting is performed using another one wavelength having a different sign and one of the remaining wavelength. The wavelengths can comply with the overlay measurement results by performing weighting. For example, if the measurement value of a wavelength of 660 nm is negative, the measurement value of a wavelength of 730 nm is positive, and the measurement value of a wavelength of 760 nm is negative, outputs of light of the wavelength of 760 nm and the wavelength of 660 nm (or the wavelength of 760 nm) are weighted and averaged. Accordingly, it is possible to comply with the overlay measurement results (standard) or generate illumination light. Any of the wavelength may be selected regarding wavelengths of two kinds in which the signs of the measurement values are the same as each other, and a wavelength may be selected from the intensity ratio with respect to a different mark observed in the same visual field.

Regarding the wavelengths of three kinds, if the signs of the measurement values are the same signs in all the wavelengths of three kinds, there is a need to remove an offset portion even if any wavelength is selected. In this case, the ratio of weighting can be determined from the amount of light of the mark for rough alignment observed at the same time.

Figure 14:
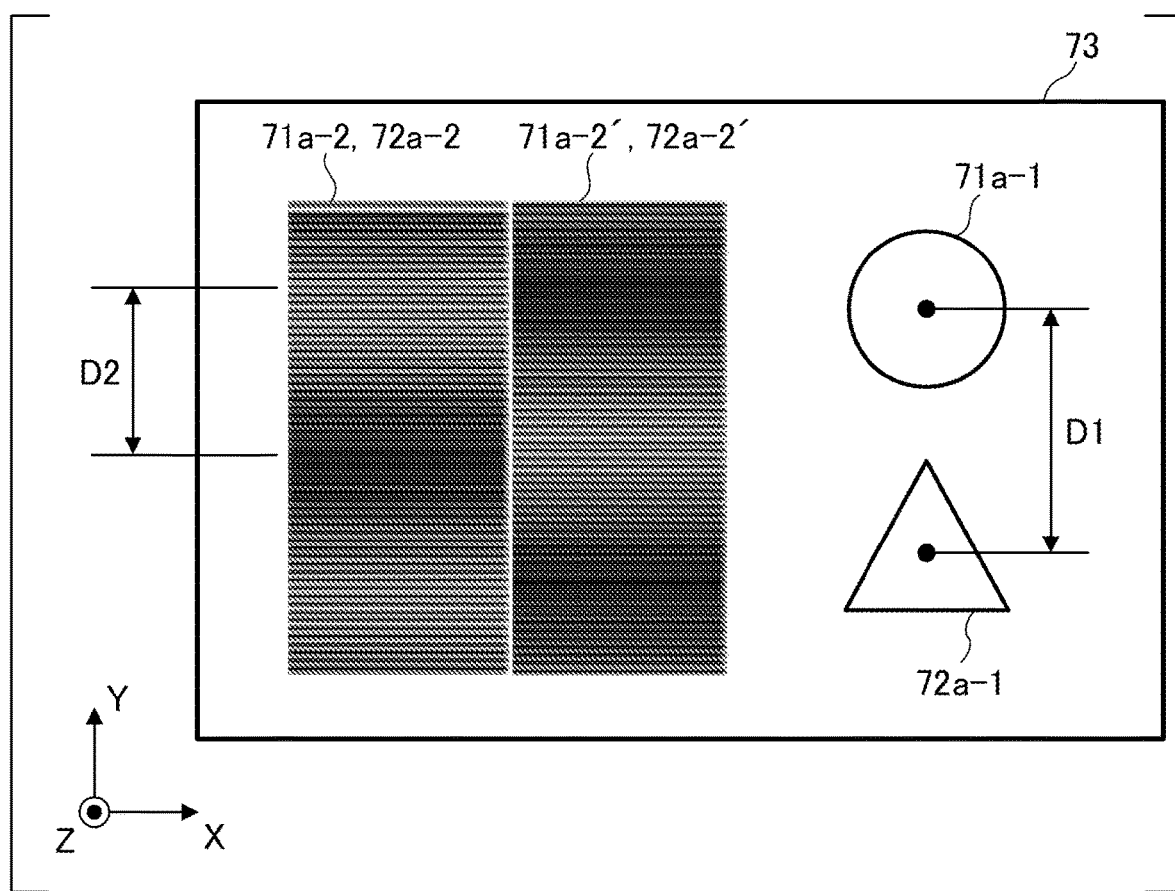
FIG. 14 is an example of disposition of a mark within a visual field according to Example 1.

Here, the marks observed in the same visual field will be described in detail. FIG. 14 is a view schematically showing the alignment mark measured when the mold 7 and the wafer 8 are overlaid. A range 73 in an outer frame indicates a range which can be observed by the position measurement apparatus at one time. On the basis of a geometrically central position of a mold mark 71a-1 and a wafer mark 72a-1, a relative positional deviation D1 of the mold 7 and the wafer 8 can be obtained from the measurement results of the mark position of the measurement optical system 3. The mold mark 71a-1 and the wafer mark 72a-1 can be reduced in size. Accordingly, rough alignment can be performed using a mark having a small exclusive region. At this time, the intensity ratio is generated in the mark detected due to the difference between reflectances of the mold mark 71a-1 and the wafer mark 72a-1. When the intensity ratio is significant, irradiation is performed with illumination of brightness capable of detecting the mark having a weak intensity. Therefore, the mark having a strong intensity is saturated, and a measurement error occurs. For this reason, there is a need to curb the intensity ratio of the mark.

Next, moire fringes formed by overlaying a mold mark 71a-2 and a wafer mark 72a-2 will be described below. The mold mark 71a-2 and the wafer mark 72a-2 are constituted to have regular patterns illustrated in FIG. 8C or 8D. Since the regularity in the measurement direction is minutely different, when they are overlaid, moire fringes are formed in the Y direction. In addition, shift directions of moire fringes when the relative position varies due to a difference between the regularities of the mold mark 10 and the wafer mark 11.

For example, if the regularity of the mold mark 71a-2 is minutely larger than the regularity of the wafer mark, if the wafer 8 shifts in a relatively positive Y direction, moire fringes also shift in the positive Y direction. On the other hand, if the regularity of the mold mark 10 is minutely smaller than the regularity of the wafer mark 11, if the wafer 8 shifts in a relatively positive Y direction, moire fringes shift in a negative Y direction. Here, moire fringes (71a-2' and 72a-2') in a second stage are formed in the mold mark 71a-2' and the wafer mark 72a-2', the regularities of the mold mark 71a-2 and the wafer mark 72a-2 in the measurement direction are switched between. For this reason, if the relative positions vary, the positions of the moire fringe in the second stage to be measured changes in the opposite direction. Further, the relative positional deviations of the mold 7 and the wafer 8 are obtained from a relative positional deviation D2. At this time, even if regular marks on the mold side and the substrate side generating moire signals deviate by one regularity, the deviation by one regularity cannot be detected due to the principle in detecting a moire signal. For this reason, it is confirmed there is no relative positional deviation between the mold 7 and the wafer 8 by one regularity using the mold mark 71a-1 and the wafer mark 72a-1 having low measurement accuracy.

The mold mark 71a-1 and the wafer mark 72a-1 may be marks generating a moire signal if the regular marks on the mold 7 side and the wafer 8 side have a pitch not causing a positional error by one regularity.

Since the mold mark 71a-1 and the wafer mark 72a-1 are constituted of different substances, the detected amount of light may vary depending on the wavelength. For this reason, the intensity ratio of the mark can be changed by changing outputs of light of lasers of three kinds. Thus, weighting is performed for outputs of lasers of three kinds to be in a range in which the intensity ratio of the moire fringes of the mold mark 71a-1 and the wafer mark 72a-1 can be measured. Accordingly, the moire fringes of the mold mark 71a-1 and the wafer mark 72a-1 can be measured in measurement of one time.

In addition, the measurement values in wavelengths other than the wavelengths of three kinds which are actually measured can be presumed by performing a simulation applying an error having an asymmetric shape postulated in structures of the mold 7 and the wafer 8. Accordingly, the sensitivity of each wavelength with respect to the amount of asymmetrical error in the mark shape can be calculated, and the wavelength in which the sensitivity becomes low can be preferentially used.

Figure 15A:
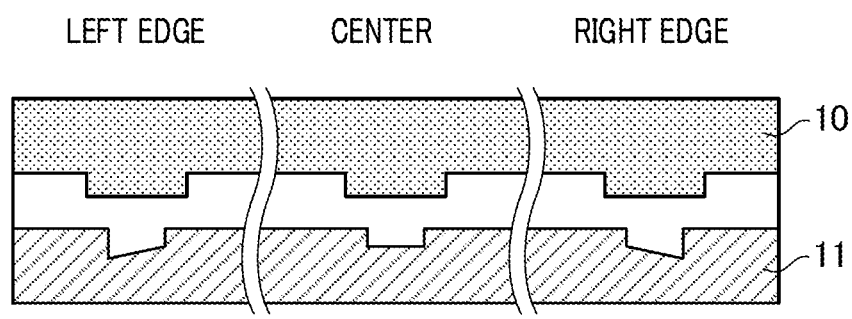
FIGS. 15A and 15B are views illustrating a measurement error occurring within a wafer surface according to Example 1.
Figure 15B:
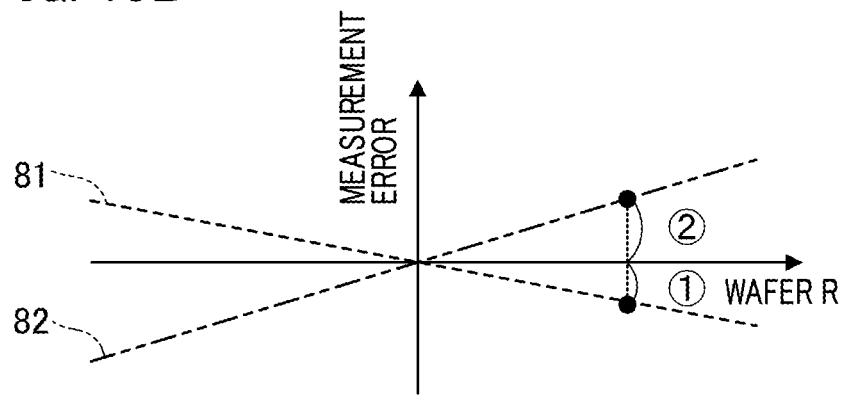

Hereinafter, with reference to FIGS. 15 to 17, a distribution of measurement errors within a surface of the wafer 8 will be described. FIGS. 15 to 17 are views illustrating an example of a measurement error generated within the surface of the wafer 8. FIG. 15A is a schematic view of a difference between the patterns of the marks at a wafer position. In FIG. 15A, each of the mold mark 10 and the wafer mark 11 is illustrated at a left edge, a central part, and a right edge in the wafer 8. If a part on the wafer 8 is coated with a solvent such as the resin 9 (an imprint material or a resist) through spin coating, unevenness of the film thickness occurs in a manner of being symmetrical to the center of the wafer 8. For this reason, an asymmetric processing error gradually occurs in a manner of being symmetrical to the center depending on the conditions for forming a wafer pattern, and thus significant asymmetry is generated at the wafer edge. In this case, the shape of an asymmetric processing error in the pattern increases in a radial direction of the wafer (radial direction of the wafer 8). Therefore, if measurement is performed in a single wavelength, a measurement error increases in the radial direction of the wafer. For example, the radial direction of the wafer is a direction such as a direction from the center of gravity of the wafer 8 or the radial direction of the wafer 8. FIG. 15B illustrate an example thereof. The horizontal axis indicates the position in the radial direction of the wafer, and the vertical axis indicates a measurement error with respect to a true position. For example, the true position is measured and obtained using a measurement apparatus or the like outside a standard apparatus. Each of the lines of a condition 81 and the condition 82 in FIG. 15B indicates a measurement error in a different wavelength. In addition, the lines of the condition 81 and the condition 82 illustrated in FIG. 15B are examples and the measurement errors are expressed by a linear function in the radial direction of the wafer. However, a high order component may be included therein.

If measurement is performed in a single wavelength, a measurement error occurs in the radial direction of the wafer. However, a measurement error in the radial direction of the wafer can be reduced or eliminated by measuring a plurality of wavelengths in a mixed manner. For example, by having the case in FIG. 15B as an example, if combining is performed at a ratio of 2 (light intensity of the wavelength of the condition 81) to 1 (light intensity of the wavelength of the condition 82), the measurement error becomes zero in the radial direction of the wafer. For this reason, measurement can be performed with high accuracy (relative positions of the mold mark 10 and the wafer mark 11) regardless of a predetermined position in the radial direction of the wafer.

Figure 16A:
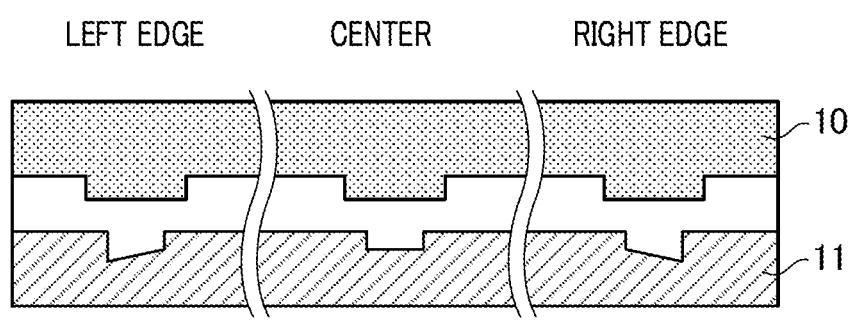
FIGS. 16A and 16B are views illustrating another measurement error occurring within the wafer surface according to Example 1.
Figure 16B:
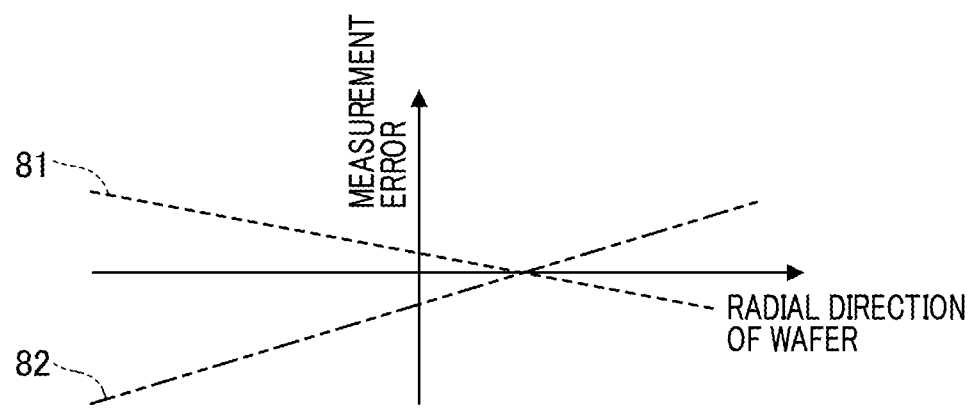

Here, the true position can also be obtained by weighting and averaging the measurement results obtained in the condition 81 and the condition 82 at a ratio, that is, a ratio of the measurement result of the condition 81 to the measurement result of the condition 82=2 (condition 81):1 (condition 82). At this time, if a measurement error is obtained by weighting and averaging the results of measurement in a single wavelength individually obtained, there is a need to measure only the number of wavelengths to be used for one mark, and thus there is a problem that the measurement time will be lengthened. Here, if illumination light is generated by combining the light intensities of the wavelengths at an optimum intensity ratio and the marks are irradiated with the light, measurement can be performed at one time. Therefore, the measurement time can be shortened. In FIG. 15A, the wafer mark 11 with the mark shape of the central portion of the wafer 8 having an ideal symmetric shape is illustrated. However, in the wafer 8 used as a sample wafer or in ordinary manufacturing, an asymmetric processing error occurs even at the center of the wafer 8. FIG. 16A illustrates a schematic view thereof. Since there is an asymmetric processing error at the central position of the wafer 8, a measurement error may occur in the measurement results in single wavelengths of the condition 81 and the condition 82. FIG. 16B illustrates an example of the measurement value at this time. In FIG. 16B, an offset occurs at the center of the wafer 8, and the measurement error becomes zero at a position having no asymmetric processing error.

Figure 17A:
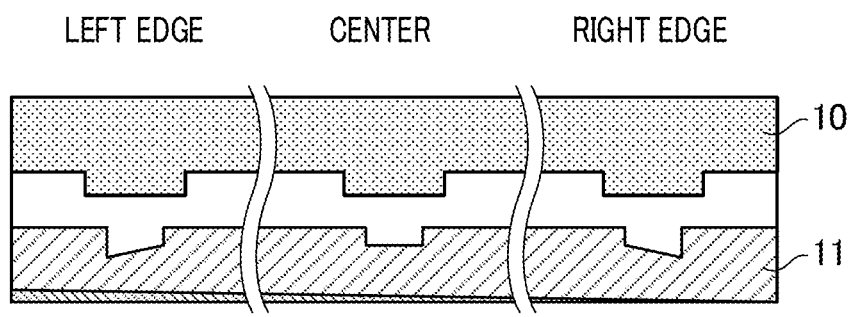
FIGS. 17A and 17B are views illustrating another measurement error occurring within the wafer surface according to Example 1.
Figure 17B:
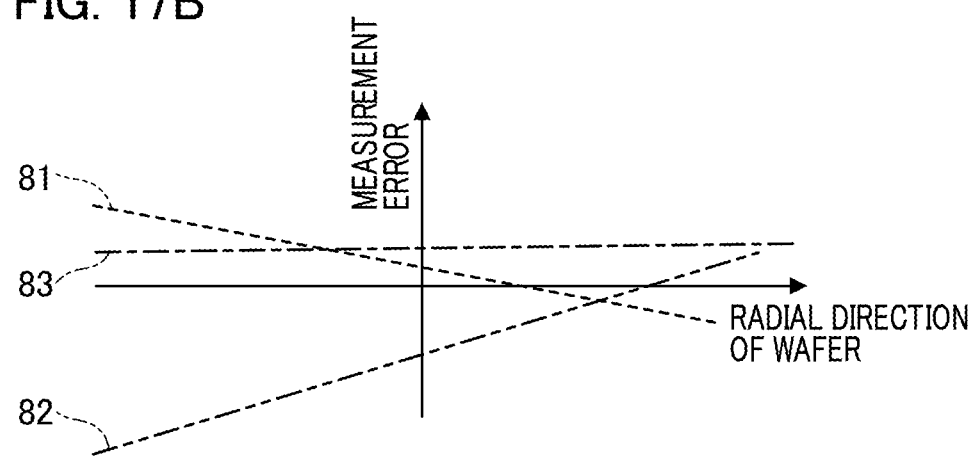

As an example, in a model as illustrated in FIG. 16, an offset of the measurement error can also be reduced or eliminated by combining the wavelengths such that inclinations of the measurement error measured in a single wavelength in the radial direction of the wafer is eliminated. However, a mark structure (a structure of the wafer mark 11) of the wafer 8 used for ordinary manufacturing is not limited to a simple structure in the model as illustrated in FIG. 16. FIG. 17A is a schematic view of an example of a model in which an asymmetric processing error occurs at two places in the wafer 8. FIG. 17B illustrates an example of the measurement results in a single wavelength in the model illustrated in FIG. 17A. Here, in the condition 81 and the condition 82 illustrated in FIG. 17, the ratio of the inclinations of the measurement errors in the radial direction of the wafer is set to 1:2. In this case, an offset occurs in the measurement errors if weighting and averaging the condition 81 and the condition 82 at a ratio of 2 (condition 81):1 (condition 82) such that the inclinations of the measurement errors in the radial direction of the wafer are eliminated. Here, if there are only two conditions such as the condition 81 and the condition 82, an offset (offset amount) cannot be reduced or removed. However, if a wavelength of a condition 83 can be selected, not only the inclinations of the measurement errors in the radial direction of the wafer can be reduced or eliminated but also an offset can be reduced or removed by weighting and averaging the condition 81, the condition 82, and the condition 83.

Here, if the number of selectable wavelengths is small, a case in which the inclinations of the measurement errors in the radial direction of the wafer are reduced or eliminated but an offset cannot be reduced or removed by combining the light intensity ratios of the wavelengths is assumed. For this reason, if the number of selectable wavelengths is large, the light intensity ratio of an optimum wavelength can be adjusted and selected with respect to the fact that the inclinations of the measurement errors are reduced or eliminated and an offset is reduced or removed. In addition, an offset which has occurred is handled as an error occurring at all times at the time of measuring each of the pattern forming region, and measurement can be performed with high accuracy (relative positions of the mold mark 10 and the wafer mark 11) by removing these.

Figure 18:
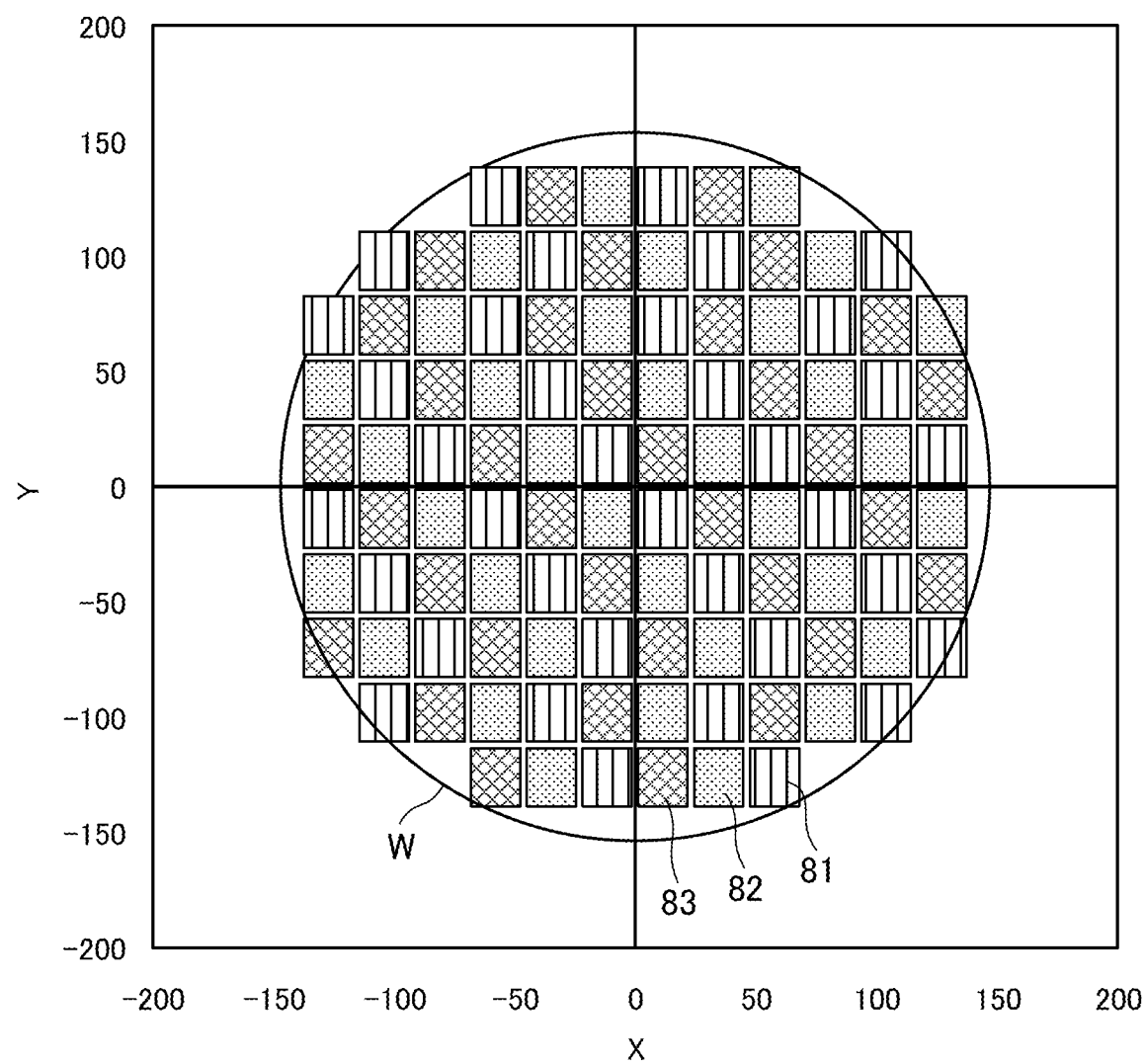
FIG. 18 is an example of a layout within a wafer surface for measuring a measurement error in a radial direction of a wafer regarding a plurality of wavelengths according to Example 1.

Hereinafter, with reference to FIG. 18, within the surface of the wafer 8, a method for acquiring a graph of a measurement error in the radial direction of the wafer in each wavelength will be described. FIG. 18 is a view illustrating an example of a layout within a surface of the wafer 8 for measuring a measurement error in the radial direction of the wafer in a plurality of wavelengths. Ordinarily, when the wafer 8 is exposed to light, it is performed in a plurality of the pattern forming region in one wafer. Here, in order to acquire a measurement error in the radial direction of the wafer, a measurement error in the radial direction of the wafer can be measured by measuring all the pattern forming regions in one wafer in one certain wavelength (particular wavelength). However, if all the pattern forming regions in one wafer are measured in the one wavelength using one certain wavelength, a difference occurs in the shape or the like due to the number of wafers 8 required as many as the number of wavelengths to be measured and the wafer 8 to be measured. As a result, an error occurs in each wafer. Here, using the method illustrated in FIG. 18, the control unit 12 can decrease an error due to the number of wafers 8 and a measurement error in the wafer 8 by performing mark position measurement (relative positions of the mold mark 10 and the wafer mark 11). In FIG. 18, the horizontal axis indicates the position in the X direction, and the vertical axis indicates the position in the Y direction. A circle W indicates the edge of the wafer 8. The demarcation having substantially a rectangular shape within the wafer surface indicates each of the pattern forming regions. Each of the condition 81, the condition 82, and the condition 83 is a condition having a different wavelength, and a difference between the wavelengths is indicated by displaying the pattern forming regions to be measured in the respective wavelengths with different hatching. In FIG. 18, as an example, three wavelengths are illustrated. That is, a measurement error with respect to the position in the radial direction of the wafer in a plurality of wavelengths in one wafer can be efficiently obtained by changing the wavelength to be used for the relative positions of the mold mark 10 and the wafer mark 11 depending on the pattern forming region.

Here, a standard evaluation value is obtained by measuring a measurement error after the wafer 8 is exposed to light using an external measuring instrument or the like, and the control unit 12 calculates the measurement error and the differential from the evaluation value thereof. Each of the measurement errors in a plurality of wavelengths can be obtained by obtaining the differential. In FIG. 18, the pattern forming region of the wafer 8 is irradiated with wavelengths for three having a certain regularity. However, the wavelengths are not limited to three wavelengths, and more wavelengths may be used. It is preferable to have at least two or more wavelengths.

Figure 19:
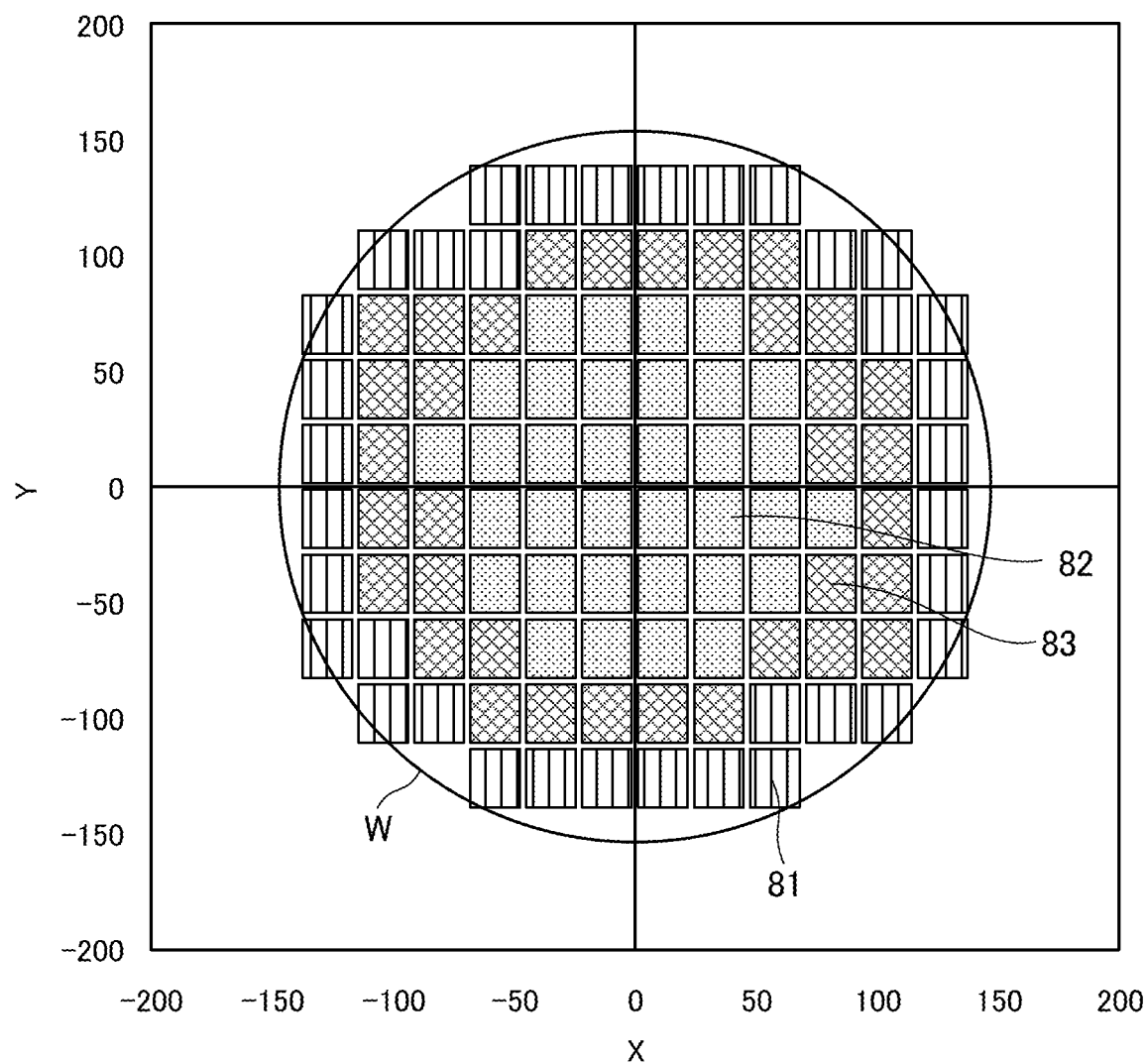
FIG. 19 is an example of a layout within a wafer surface for measuring a measurement error regarding a plurality of wavelengths according to Example 1.

FIG. 19 illustrates an example of a case in which mark position measurement is performed by distributing a certain wavelength near the center of the wafer 8 in a concentrated manner. As illustrated in FIG. 19, if mark position measurement is performed by distributing one certain wavelength only near the center within the surface of the wafer 8 in a concentrated manner, there is a problem that the distribution of the measurement values in the radial direction of the wafer can be detected only near the center in the wavelength. In FIG. 19, since the condition 82 is concentrated near the center of the wafer 8, a measurement error can be obtained only in a small range in the radial direction of the wafer in the wavelength in the condition 82. For this reason, a measurement error with respect to the true position increases, and thus a significant error occurs in an optimum intensity ratio if the light intensity ratio of the wavelength is weighted and averaged. Therefore, in order to reduce a measurement error, as illustrated in FIG. 18, it is preferable that the control unit 12 acquire a measurement error in the radial direction of the wafer in a plurality of wavelengths.

In addition, it is more preferable that a plurality of wavelengths of at least two or more kinds be randomly distributed in each of the pattern forming regions on the entire surface of the wafer 8 and a measurement error be acquired by performing mark position measurement. Specifically, a measurement error is acquired by randomly selecting one kind from at least wavelengths of two or more kinds for each of pattern forming regions and mark position measurement is performed for a certain pattern forming region. In addition, a measurement error may be acquired through mark position measurement by regularly scattering at least wavelengths of two or more kinds for each of the pattern forming regions (for each of the shot regions). Moreover, a measurement error may be acquired through mark position measurement by changing the combination of rays of light (illumination light) of wavelengths for irradiating each predetermined pattern forming region in each of the vertical direction or the transverse direction of the wafer 8. Here, a predetermined pattern forming region may be a pattern forming region which has been set in advance or a pattern forming region arbitrarily selected by a user.

Figure 20:
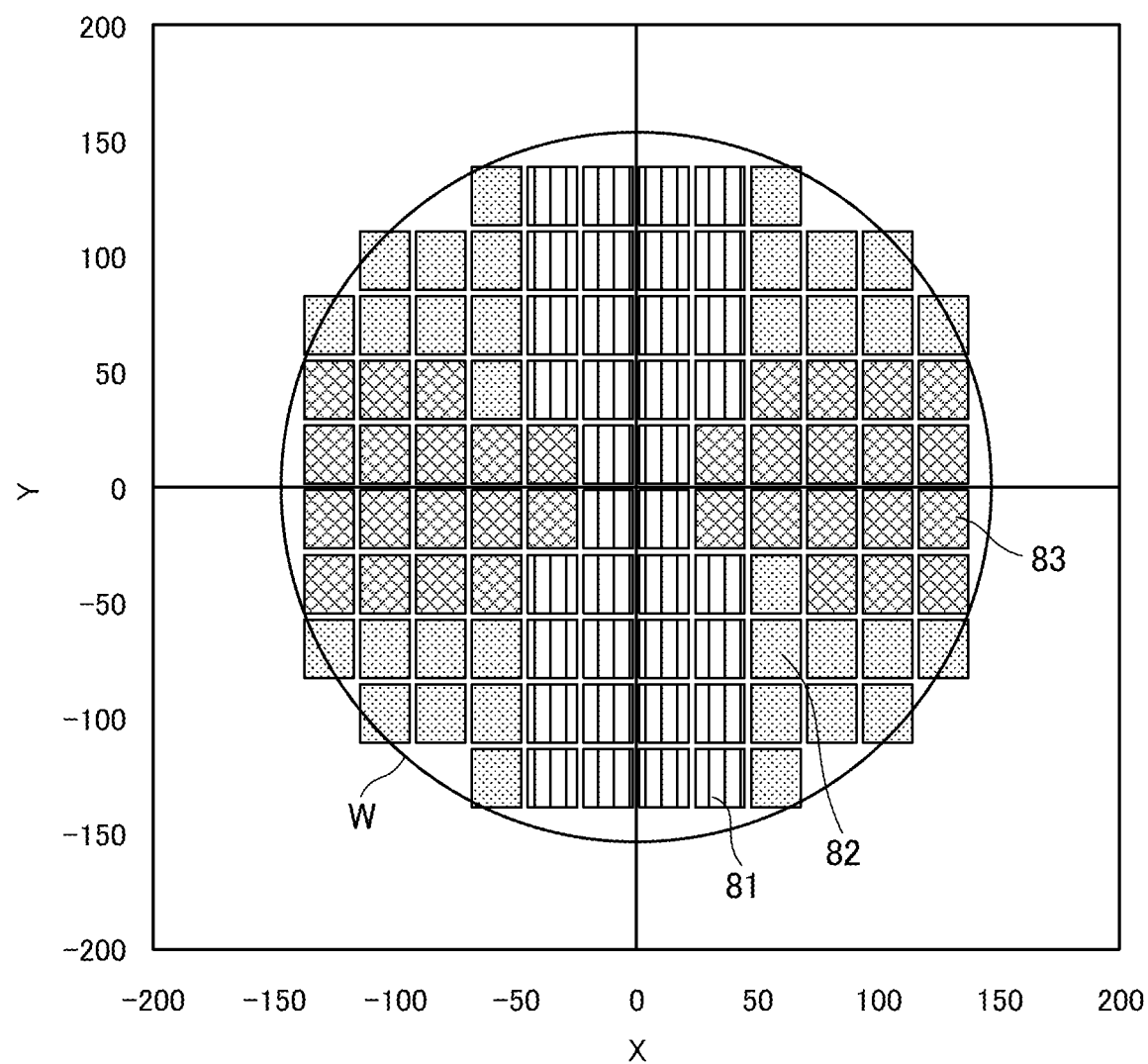
FIG. 20 is an example of another layout within a wafer surface for measuring a measurement error regarding a plurality of wavelengths according to Example 1.

FIG. 20 illustrates an example of a case in which mark position measurement is performed by distributing a certain wavelength in a predetermined direction on a horizontal surface of the wafer 8. A direction on a horizontal surface indicates the X direction (transverse direction) or the Y direction (vertical direction) on a surface of the wafer 8. As illustrated in FIG. 20, in addition to the radial direction of the wafer, a particular wavelength distribution may be present in the X direction or the Y direction of the wafer 8 depending on the structure of the cross section of the wafer 8. In FIG. 20, the condition 81 has a distribution in the Y direction, and the condition 83 has a distribution in the X direction. Here, for example, if the shape pattern of the wafer mark 11 is formed with an asymmetric processing error in the X direction, an inclination of a measurement error occurs in the X direction of the wafer 8 when measuring is performed in a single wavelength. For this reason, there is a need to determine the light intensity ratio of the wavelength such that a measurement error in the X direction of the wafer 8 is reduced or eliminated. The same applies to the Y direction as that in the X direction. For this reason, for example, even if a measurement error in each wavelength is acquired in the case of the distribution illustrated in FIG. 20, the measurement error increases. It is difficult to accurately acquire a distribution of measurement errors in the X direction in the condition 81, and it is difficult to accurately acquire a distribution of measurement errors in the Y direction in the condition 83. Therefore, the measurement errors increase even if weighting and averaging are performed. Therefore, there is a need to reduce the measurement errors by performing mark position measurement using the method described above.

In the example described above, a measurement error in the radial direction of the wafer is acquired from data of one wafer. However, similar measurement may be performed for a plurality of wafers, and the average value thereof may be used. It is possible to enhance the accuracy in acquiring a distribution of measurement errors by using a value obtained from the averaged value.

Figure 21B:
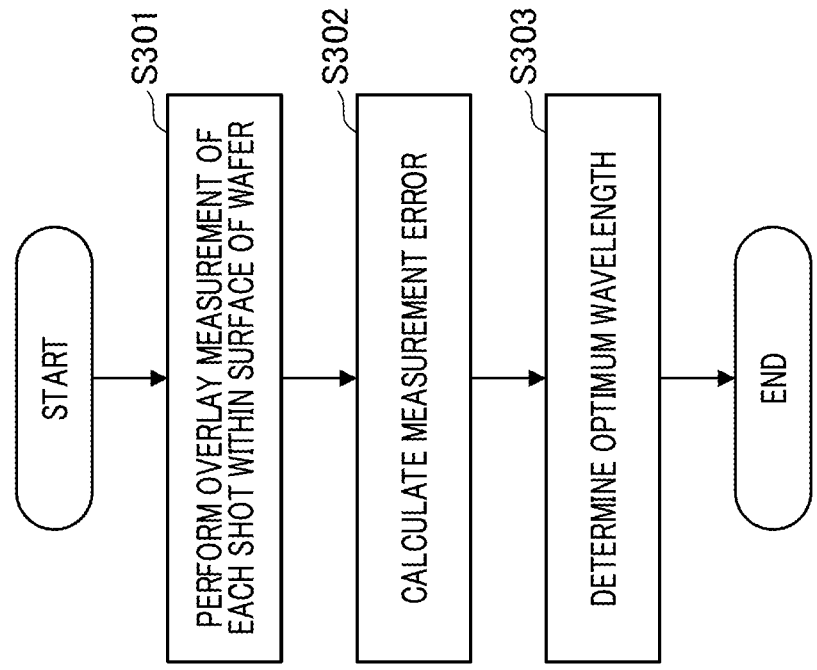
FIGS. 21A and 21B are sequence diagrams for measuring a measurement error within a wafer surface regarding a plurality of wavelengths according to Example 1.
Figure 21A:
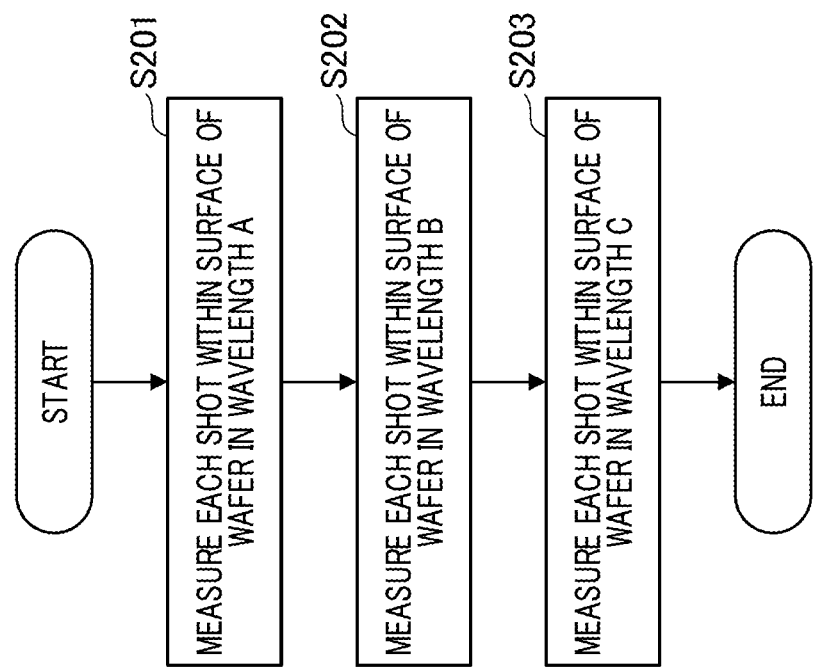

Hereinafter, a method for acquiring a measurement error in the radial direction of the wafer will be described with reference to FIG. 21. FIG. 21 is an example of a sequence diagram for measuring a measurement error within a surface of the wafer 8 in a plurality of wavelengths. FIG. 21A illustrates details of the processing of Step S104 in FIG. 11, and FIG. 21B illustrates details of the processing of Step S105 in FIG. 11. The operation of the imprint apparatus 1 including the position measurement apparatus in FIG. 21 is controlled by the control unit 12 (control unit).

As illustrated in FIG. 21, measurement errors are acquired respectively in three wavelengths. First, in Step S201, a measurement error is acquired by performing mark position measurement of each of pattern forming regions within the surface of the wafer 8 using illumination light of a particular wavelength (wavelength A) by the position measurement apparatus inside the imprint apparatus 1. Next, in Step S202, a measurement error is acquired by performing mark position measurement of each of pattern forming regions within the surface of the wafer 8 using illumination light of a particular wavelength (wavelength B) by the position measurement apparatus inside the imprint apparatus 1. Next, in Step S203, a measurement error is acquired by performing mark position measurement of each of pattern forming regions within the surface of the wafer 8 using illumination light of a particular wavelength (wavelength C) by the position measurement apparatus inside the imprint apparatus 1. In FIG. 12, as an example, mark position measurement is performed for three wavelengths, but the number of wavelengths is not limited thereto. Three or more wavelengths may be used. In this case, similar processing may be performed as many times as the number of wavelengths to be used.

When the processing of Steps S201 to S203 is performed, as illustrated in FIG. 18, it is preferable that a plurality of wavelengths of at least two or more kinds be randomly distributed on the entire surface of the wafer 8 and irradiation be performed. In addition, if the wavelength is changed from a particular wavelength to another wavelength, measurement immediately after the change may become unstable. Therefore, for example, it is preferable that a next pattern forming region be measured without changing the wavelength, instead of performing measurement by changing the wavelength for each of the pattern forming regions. Specifically, a measurement error is acquired by performing mark position measurement for each of the pattern forming regions measured in the wavelength A within the wafer surface in a particular wavelength (wavelength A). After the measurement in the wavelength A is completed, a measurement error is acquired by performing mark position measurement of each of the pattern forming regions in which the wavelength B is measured in a region in which the wavelength A is not measured in a particular wavelength (wavelength B) other than the wavelength A. After the measurement in the wavelength B is completed, a measurement error is acquired by performing mark position measurement of the pattern forming regions in which the wavelength C is measured in a region in which the wavelength A and the wavelength B are not measured in a particular wavelength (wavelength C) other than the wavelength A and the wavelength B.

Next, in Step S301, the overlay state of the wafer 8 is measured (inspected) using an inspection apparatus such as an external overlay inspection apparatus, and an overlay error is measured and acquired. At this time, the measured value is the true position. Next, in Step S302, a measurement error is obtained from the differential between the measurement value by the position measurement apparatus inside the imprint apparatus 1 and the true position obtained by the external overlay inspection apparatus or the like. Next, in Step S303, an optimum wavelength is calculated on the basis of the inclinations of the measurement errors in the radial direction of the wafer and the amount of offset.

If conditions of an optimum wavelength are set using two or more wafers 8, measurement is performed by repeating the processing in FIGS. 21A and 21B as many times as the number of wafers 8, and an optimum wavelength may be obtained by averaging the obtained light intensity ratios of wavelengths. Here, the light intensity ratio of an optimum wavelength may be obtained in a distribution of the pattern forming region which is perfectly the same as that of the first wafer. In the second wafer, it may be measured as another distribution different from the distribution of the pattern forming regions in the first wafer 8. It is possible to obtain a more reliable light intensity ratio of a wavelength by averaging the calculation results in a plurality of wafers 8.

Example has been described above based on the imprint apparatus 1, but it is also applied to a semiconductor exposure apparatus in a similar manner. In addition, regarding a method for measuring the relative positions of the mold 7 and the wafer 8, a detection method using a moire fringe has been described. However, Example 1 can also be applied if a pattern at a position on a wafer is measured in a bright visual field and a dark visual field, or in a measurement method for measuring diffracted light from a pattern.

Embodiment of Article Manufacturing Method

Next, a method for manufacturing a semiconductor device (a semiconductor IC element, a liquid crystal display element, an MEMS, and the like) utilizing the exposure apparatus described above (the imprint apparatus 1 having a position measurement apparatus) will be described. The semiconductor device uses the exposure apparatus described above and has performing position measurement of the wafer 8 and the mold 7. Moreover, the semiconductor device has pattern forming of forming a pattern on the wafer 8 after the performing position measurement. Moreover, the semiconductor device has at least processing in which the wafer 8 having a pattern formed in the pattern forming is processed, and manufacturing an article from a processed substrate. The processing includes etching, resist peeling, dicing, bonding, packaging, and the like. According to this method for manufacturing a semiconductor device, it is possible to manufacture a semiconductor device having higher quality than that in the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-027874, filed Feb. 21, 2020, which is hereby incorporated by reference wherein in its entirety.

What is claimed is:

1. A position measurement apparatus measuring a position of a target, the position measurement apparatus comprising:
an illumination unit configured to illuminate the target with illumination light including light of a first wavelength and light of a second wavelength different from the first wavelength;
a measurement unit configured to measure the position of the target by detecting light from the target illuminated with the illumination light; and
a control unit configured to adjust a ratio of a light intensity of the first wavelength to a light intensity of the second wavelength such that a measurement error varying depending on the position of the target in the measurement unit is reduced,
wherein the target includes a substrate, and
wherein the control unit adjusts the ratio of the light intensity of the first wavelength to the light intensity of the second wavelength such that the measurement error in a radial direction of the substrate is reduced.

2. The position measurement apparatus according to claim 1,
wherein the control unit performs adjustment through weighting of adjustment of the ratio of the light intensity of the first wavelength to the light intensity of the second wavelength.

3. The position measurement apparatus according to claim 1,
wherein the control unit adjusts the ratio of the light intensity of the first wavelength to the light intensity of the second wavelength such that the measurement error in a direction from a center of gravity of the target is reduced.

4. The position measurement apparatus according to claim 1,
wherein the control unit adjusts the ratio of the light intensity of the first wavelength to the light intensity of the second wavelength depending on a predetermined position of the target such that the measurement error is reduced.

5. The position measurement apparatus according to claim 1,
wherein the control unit adjusts the ratio of the light intensity of the first wavelength to the light intensity of the second wavelength such that the measurement error in a predetermined direction on a horizontal surface of the target is reduced.

6. The position measurement apparatus according to claim 1,
wherein the control unit illuminates the target by individually scattering the illumination light including the first wavelength and the second wavelength in a regular manner for each of pattern forming regions of the target.

7. The position measurement apparatus according to claim 1,
wherein the control unit changes a combination of the illumination light including the first wavelength and the second wavelength for illuminating each of predetermined pattern forming regions in each of a vertical direction or a transverse direction in the target.

8. The position measurement apparatus according to claim 1,
wherein the control unit randomly selects one from at least wavelengths of two or more kinds including the first wavelength and the second wavelength and causes the target to be illuminated.

9. The position measurement apparatus according to claim 1,
wherein the control unit adjusts the ratio of the light intensity of the first wavelength to the light intensity of the second wavelength such that an offset amount of measurement error is reduced.

10. The position measurement apparatus according to claim 1,
wherein the target includes a predetermined mark.

11. The position measurement apparatus according to claim 10,
wherein the predetermined mark has a regular pattern.

12. The position measurement apparatus according to claim 1,
wherein the illumination light is light in which rays of laser light having different wavelengths are combined.

13. The position measurement apparatus according to claim 1,
wherein the illumination light is light transmitted through a filter allowing a particular wavelength bandwidth to be transmitted therethrough having a broad wavelength distribution.

14. The position measurement apparatus according to claim 1,
wherein the control unit adjusts the ratio of the light intensity of the first wavelength to the light intensity of the second wavelength based on a simulation.

15. An overlay inspection apparatus measuring relative positions of a substrate and a mold and constituted to illuminate a predetermined mark provided in at least one of the substrate and the mold using an illumination unit of a position measurement apparatus, the position measurement apparatus including
the illumination unit configured to illuminate a target with illumination light including light of a first wavelength and light of a second wavelength different from the first wavelength,
a measurement unit configured to measure a position of the target by detecting light from the target illuminated with the illumination light, and
a control unit configured to adjust a ratio of a light intensity of the first wavelength to a light intensity of the second wavelength such that a measurement error varying depending on the position of the target in the measurement unit is reduced,
wherein the target includes a substrate, and
wherein the control unit adjusts the ratio of the light intensity of the first wavelength to the light intensity of the second wavelength such that the measurement error in a radial direction of the substrate is reduced.

16. A position measurement method for measuring a position of a target, the position measurement method comprising:
illuminating the target with illumination light including light of a first wavelength and light of a second wavelength different from the first wavelength;

measuring the position of the target by detecting light from the target illuminated with the illumination light; and adjusting a ratio of a light intensity of the first wavelength to a light intensity of the second wavelength such that a measurement error varying depending on the position of the target in the measuring is reduced, wherein the target includes a substrate, and wherein the ratio of the light intensity of the first wavelength to the light intensity of the second wavelength is adjusted such that the measurement error in a radial direction of the substrate is reduced.

17. An imprint apparatus transferring a pattern of a mold onto a substrate, the imprint apparatus comprising:
one or more processors connected to one or more memories, the one or more processors being configured to:
acquire information of a ratio of a light intensity of a first wavelength to a light intensity of a second wavelength such that a measurement error in a radial direction of the substrate is adjusted to be reduced in advance;
illuminate a predetermined mark formed in at least one of the substrate and the mold with illumination light based on the acquired information;
measure relative positions of the substrate and the mold by detecting light from the mark illuminated with the illumination light; and
align the substrate and the mold on the basis of the relative positions.

18. An article manufacturing method comprising:
pattern forming of forming a pattern on a substrate using an imprint apparatus including
one or more processors connected to one or more memories, the one or more processors being configured to:
acquire information of a ratio of a light intensity of a first wavelength to a light intensity of a second wavelength such that a measurement error in a radial direction of a substrate is adjusted to be reduced in advance,
illuminate a predetermined mark formed in at least one of the substrate and a mold with illumination light based on the acquired information,
measure relative positions of the substrate and the mold by detecting light from the mark illuminated with the illumination light, and
align the substrate and the mold on the basis of the relative positions;
processing the substrate on which the pattern is formed in the pattern forming; and
manufacturing an article from the processed substrate.

* * * * *